(12) United States Patent
Kuhr et al.

(10) Patent No.: US 8,323,769 B2
(45) Date of Patent: Dec. 4, 2012

(54) METHODS OF TREATING A SURFACE TO PROMOTE METAL PLATING AND DEVICES FORMED

(75) Inventors: Werner G. Kuhr, Denver, CO (US); Steven Z. Shi, Highlands Ranch, CO (US); Jen-Chieh Wei, Highlands Ranch, CO (US); Zhiming Liu, Englewood, CO (US); Lingyun Wei, Englewood, CO (US)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 12/628,978

(22) Filed: Dec. 1, 2009

(65) Prior Publication Data
US 2010/0071938 A1 Mar. 25, 2010

Related U.S. Application Data

(62) Division of application No. 11/848,860, filed on Aug. 31, 2007.

(51) Int. Cl.
B32B 3/10 (2006.01)
B32B 15/04 (2006.01)
B32B 15/08 (2006.01)

(52) U.S. Cl. ..... 428/137; 428/413; 428/457; 428/473.5; 428/901

(58) Field of Classification Search ............... None
See application file for complete search history.

(56) References Cited

U.S. PATENT DOCUMENTS

| | | |
|---|---|---|
| 3,011,920 A | 12/1961 | Shipley, Jr. |
| 3,532,518 A | 10/1970 | D'Ottavio et al. |
| 3,770,598 A | 11/1973 | Creutz |
| 3,876,513 A | 4/1975 | Brown et al. |
| 4,073,740 A | 2/1978 | Polichette et al. |
| 4,089,686 A | 5/1978 | Townsend |
| 4,152,477 A | 5/1979 | Haruta et al. |
| 4,374,709 A | 2/1983 | Combs |
| 4,376,685 A | 3/1983 | Watson |
| 4,446,176 A | 5/1984 | Close |
| 4,448,804 A | 5/1984 | Amelio et al. |
| 4,478,883 A | 10/1984 | Bupp et al. |
| 4,515,829 A | 5/1985 | Deckert et al. |

(Continued)

FOREIGN PATENT DOCUMENTS

JP 2000096213 A * 4/2000

(Continued)

OTHER PUBLICATIONS

Machine translation of JP 2000-096213, Apr. 2000.*

(Continued)

Primary Examiner — Ramsey Zacharia
(74) Attorney, Agent, or Firm — Nixon Peabody LLP

(57) ABSTRACT

Embodiments of the present invention provide methods of treating a surface of a substrate. In one particular aspect, embodiments of the present invention provide methods of treating a surface of a substrate that promote binding of one or more metal elements to the surface. According to some embodiments of the invention, films are formed on any conducting, semiconductive or non-conductive surface, by thermal reaction of molecules containing reactive groups in an organic solvent or in aqueous solution. The thermal reaction may be produced under a variety of conditions. In another aspect, the present invention provides a printed circuit board, comprising: at least one substrate; a layer of organic molecules attached to the at least one substrate; and a metal layer atop said layer of organic molecules.

6 Claims, 18 Drawing Sheets

U.S. PATENT DOCUMENTS

| | | | |
|---|---|---|---|
| 4,554,182 A | 11/1985 | Bupp et al. | |
| 4,555,315 A | 11/1985 | Barbieri et al. | |
| 4,592,852 A | 6/1986 | Courduvelis et al. | |
| 4,608,275 A | 8/1986 | Kukanskis et al. | |
| 4,634,468 A | 1/1987 | Gulla et al. | |
| 4,673,459 A | 6/1987 | Elmore et al. | |
| 4,803,097 A | 2/1989 | Fraenkel et al. | |
| 4,810,333 A | 3/1989 | Gulla et al. | |
| 4,904,506 A | 2/1990 | Burnett et al. | |
| 4,919,768 A | 4/1990 | Bladon | |
| 4,948,707 A | 8/1990 | Johnson et al. | |
| 4,976,990 A | 12/1990 | Bach et al. | |
| 5,015,339 A | 5/1991 | Pendleton | |
| 5,051,154 A | 9/1991 | Bernards et al. | |
| 5,068,013 A | 11/1991 | Bernards et al. | |
| 5,174,886 A | 12/1992 | King et al. | |
| 5,207,888 A | 5/1993 | Bladon | |
| 5,227,013 A * | 7/1993 | Kumar | 216/18 |
| 5,268,088 A | 12/1993 | Okabayashi | |
| 5,318,803 A | 6/1994 | Bickford et al. | |
| 5,342,501 A | 8/1994 | Okabayashi | |
| 5,342,654 A | 8/1994 | Koizumi et al. | |
| 5,389,496 A | 2/1995 | Calvert et al. | |
| 5,425,873 A | 6/1995 | Bladon et al. | |
| 5,455,072 A | 10/1995 | Bension et al. | |
| 5,648,125 A | 7/1997 | Cane | |
| 5,721,014 A | 2/1998 | Falker et al. | |
| 5,745,984 A | 5/1998 | Cole et al. | |
| 5,985,785 A | 11/1999 | Lane et al. | |
| 6,208,553 B1 | 3/2001 | Gryko et al. | |
| 6,212,093 B1 | 4/2001 | Lindsey | |
| 6,221,653 B1 | 4/2001 | Caren et al. | |
| 6,272,038 B1 | 8/2001 | Clausen et al. | |
| 6,284,317 B1 | 9/2001 | Laibinis et al. | |
| 6,324,091 B1 | 11/2001 | Gryko et al. | |
| 6,330,108 B1 | 12/2001 | Nishikouji et al. | |
| 6,381,169 B1 | 4/2002 | Bocian et al. | |
| 6,451,942 B1 | 9/2002 | Li et al. | |
| 6,593,656 B2 | 7/2003 | Anh et al. | |
| 6,642,376 B2 | 11/2003 | Lindsey et al. | |
| 6,657,884 B2 | 12/2003 | Bocian et al. | |
| 6,674,121 B2 | 1/2004 | Misra et al. | |
| 6,728,129 B2 | 4/2004 | Lindsey et al. | |
| 6,777,516 B2 | 8/2004 | Li et al. | |
| 6,828,581 B2 | 12/2004 | Zangmeister et al. | |
| 6,919,128 B2 | 7/2005 | McCreery | |
| 6,943,054 B2 | 9/2005 | Bocian et al. | |
| 7,025,716 B1 | 4/2006 | Meloul et al. | |
| 7,026,051 B2 | 4/2006 | Schauer et al. | |
| 7,026,716 B2 | 4/2006 | Ramanath et al. | |
| 7,061,791 B2 | 6/2006 | Bocian et al. | |
| 7,101,591 B2 | 9/2006 | Hayashi et al. | |
| 7,141,299 B2 | 11/2006 | McCreery | |
| 7,182,821 B2 | 2/2007 | Izumi et al. | |
| 7,217,769 B2 | 5/2007 | Zamora et al. | |
| 7,223,628 B2 | 5/2007 | Bocian et al. | |
| 7,332,599 B2 | 2/2008 | Yu et al. | |
| 7,452,572 B1 | 11/2008 | Bocian et al. | |
| 2001/0026120 A1 | 10/2001 | Fukuyoshi et al. | |
| 2002/0076714 A1 | 6/2002 | Kuhr et al. | |
| 2002/0154535 A1 | 10/2002 | Bocian et al. | |
| 2002/0180446 A1 | 12/2002 | Kuhr et al. | |
| 2003/0081463 A1 | 5/2003 | Bocian et al. | |
| 2003/0082444 A1 | 5/2003 | Kuhr et al. | |
| 2003/0111670 A1 | 6/2003 | Misra et al. | |
| 2003/0169618 A1 | 9/2003 | Lindsey et al. | |
| 2004/0115524 A1 | 6/2004 | Misra et al. | |
| 2004/0120180 A1 | 6/2004 | Rotenberg et al. | |
| 2004/0150465 A1 | 8/2004 | Nishida et al. | |
| 2004/0161545 A1 | 8/2004 | Montano et al. | |
| 2004/0191536 A1 | 9/2004 | Heimann et al. | |
| 2004/0231141 A1 | 11/2004 | Nishinaka et al. | |
| 2004/0248428 A1 | 12/2004 | Bureau et al. | |
| 2005/0041494 A1 | 2/2005 | Bocian et al. | |
| 2005/0048691 A1 | 3/2005 | Bocian et al. | |
| 2005/0056616 A1 | 3/2005 | Cooper et al. | |
| 2005/0062097 A1 | 3/2005 | Misra et al. | |
| 2005/0069648 A1 | 3/2005 | Maruyama | |
| 2005/0162895 A1 | 7/2005 | Kuhr et al. | |
| 2005/0181195 A1 | 8/2005 | Dubrow | |
| 2005/0185447 A1 | 8/2005 | Kuhr et al. | |
| 2005/0207208 A1 | 9/2005 | Bocian et al. | |
| 2005/0243597 A1 | 11/2005 | Gallo et al. | |
| 2005/0270820 A1 | 12/2005 | Mobley et al. | |
| 2005/0271828 A1 | 12/2005 | Saito et al. | |
| 2006/0081950 A1 | 4/2006 | Kuhr et al. | |
| 2006/0092687 A1 | 5/2006 | Kuhr et al. | |
| 2006/0103018 A1 | 5/2006 | Bureau et al. | |
| 2006/0108320 A1 | 5/2006 | Lazovsky et al. | |
| 2006/0141156 A1 | 6/2006 | Viel et al. | |
| 2006/0195296 A1 | 8/2006 | Petrich et al. | |
| 2006/0209587 A1 | 9/2006 | Bocian et al. | |
| 2006/0211236 A1 | 9/2006 | Bureau et al. | |
| 2006/0267202 A1 | 11/2006 | Matsuzaki | |
| 2007/0000865 A1 | 1/2007 | Yoo et al. | |
| 2007/0051459 A1 | 3/2007 | Yamano et al. | |
| 2007/0066090 A1 | 3/2007 | Ono et al. | |
| 2007/0108438 A1 | 5/2007 | Lindsey et al. | |
| 2007/0148421 A1 | 6/2007 | Sohn et al. | |
| 2008/0096470 A1 | 4/2008 | Hou et al. | |
| 2008/0131709 A1 | 6/2008 | Hanson et al. | |
| 2008/0209876 A1 | 9/2008 | Miller | |

FOREIGN PATENT DOCUMENTS

| | | | |
|---|---|---|---|
| WO | WO 2004/075248 A2 | 9/2004 | |
| WO | WO 2005/086826 A2 | 9/2005 | |

OTHER PUBLICATIONS

International Search Report and Written Opinion in International Application No. PCT/US2008/74887, mailed Nov. 19, 2008.

International Search Report and Written Opinion in International Application No. PCT/US2008/074895, mailed Dec. 4, 2008.

Office Action in U.S. Appl. No. 11/848,860, mailed Jan. 19, 2010.

Office Action in U.S. Appl. No. 11/848,860, mailed Aug. 27, 2010.

Asakura, S. et al., "Fabrication of Built-In Copper Microstructures on Epoxy Resin," Microelectronic Engineering, vol. 75, 2004, pp. 375-382.

Dressick, W. et al., "Covalent Binding of Pd Catalysts to Ligating Self-Assembled Monolayer Films for Selective Electroless Metal Deposition," J. Electrochem Soc., vol. 141, No. 1, Jan. 1994, pp. 210-220.

Hu, J.C. et al., "Self-Organized Nanomolecular Films on Low-Dielectric Constant Porous Methyl Silsesquioxane at Room Temperature," Journal of the Electrochemical Society, vol. 150, No. 4, 2003, pp. F61-F66.

Liu, X. et at., "Enhanced CVD of Copper Films on Self-Assembled Monolayers as Ultrathin Diffusion Barriers," Journal of the Electrochemical Society, vol. 153, No. 3, 2006, pp. C142-C145.

Jeon, N. et al., "Patterned Self-Assembled Monolayers Formed by Microcontact Printing Direct Selective Metalization by Chemical Vapor Deposition on Planar and Nonplanar Substrates," Departments of Chemistry, Harvard University, Langmuir, May 1995, pp. 3024-3026.

Krishnamoorthy, A. et al., "Self-Assembled Near-Zero Thickness Molecular Layers as Diffusion Barriers for Cu Metallization," Applied Physics Letters, American Institute of Physics, vol. 78, No. 17, Apr. 2001, pp. 2467-2469.

Kuhr, W., "Integration of Molecular Components into Silicon Memory Devices," The Electrochemical Society Interface, Spring 2004, pp. 34-38.

Murthy, B. R. et al., "Self-Assembled Monolayers as Cu Diffusion Barriers for Ultralow-k Dielectrics," Electrochemical and Solid-State Letters, vol. 9, No. 7, 2006, pp. F61-F63.

Sawada, S. et al., "Micropatterning of Copper on a Poly(ethylene terephthalate) Substrate Modified with a Self-Assembled Monolayer," American Chemical Society, Langmuir, vol. 22, No. 1, 2006, pp. 332-337.

Shih, C. H. et al., "Direct Plating of Cu on ALD TaN for 45nm-node Cu Beol Metallization," Taiwan Semiconductor Manufacturing Co., No. 8, Li-Hsin Rd. 6, Science-Based Industrial Park, IEEE, 2004, 4 pages.

Connelly, N. G. et al., "Chemical Redox Agents for Organometallic Chemistry," Chem. Rev., 1996, vol. 96, pp. 877-910.

Connelly, N.G. et al., "The Electron-Transfer Reactions for Mononuclear Organotransition Metal Complexes," Advances in Organometallic Chemistry, vol. 23, 1984, 1-93 pages.

Gassman, P. G. et al., "(Trifluoromethyl)cyclopentadienide: A Powerful Electron-Withdrawing Ligand for Transition-Metal Complexes," J. Am. Chem. Soc., 1986, vol. 108, 4228-4229.

Geiger, W. E. et al., "The Electron-Transfer Reactions of Polynuclear Organotransition Metal Complexes," Advances in Organometallic Chemistry, vol. 24, 1985, pp. 87-130.

Gryko, D.T. et al., "Thiol-Derivatized Porphyrins for Attachment to Electroactive Surfaces," J. Org. Chem., 1999, vol. 64, pp. 8635-8647.

Ng, D. K. P. et al., "Sandwich-Type Heteroleptic Phthalocyaninato and Porphyrinato Metal Complexes," Chemical Society Reviews, 1997, vol. 26, pp. 433-442.

Robbins, J. L. et al., "Syntheses and Electronic Structures of Decamethylmetallocenes," J. Am. Chem. Society, vol. 104, No. 7, 1982, pp. 1882-1893.

Office Action in U.S. Appl. No. 11/848,860, mailed Jul. 12, 2011.

Office Action in U.S. Appl. No. 11/848,860, mailed Mar. 15, 2012.

Office Action in U.S. Appl. No. 12/201,974, mailed Dec. 14, 2011.

* cited by examiner

METHODS OF TREATING A SURFACE TO PROMOTE METAL PLATING AND DEVICES FORMED

CROSS REFERENCE TO RELATED APPLICATIONS

This application is a divisional patent application of U.S. patent application Ser. No. 11/848,860 entitled "Methods of Treating a Surface to Promote Metal Plating and Devices Formed" filed on Aug. 31, 2007, the entire disclosure of which is hereby incorporated by reference.

TECHNICAL FIELD

The present invention generally relates to methods of treating a surface of a substrate, and to the use of the method and resulting films formed therefrom in various applications such as metal plating, the protection of surfaces against chemical attack, the manufacture of localized conductive coatings, the manufacture of chemical sensors (for example in the fields of chemistry and molecular biology), the manufacture of biomedical equipment, and the like. More specifically the present invention relates to methods of treating a surface to promote plating or binding of metals, and devices formed therefrom.

BACKGROUND OF THE INVENTION

Electronic components have become smaller and thinner as the desire for small, thin, and lightweight devices continues to increase. This has lead to many developments in the manufacture, design and packaging of electronic components and integrated circuits. For example, printed circuit boards (PCB) are widely used for packaging of integrated circuits and devices. Current PCB substrates must provide a variety of functions such as efficient signal transmission and power distribution to and from the integrated circuits, as well as provide effective dissipation of heat generated by the integrated circuits during operation. The substrates must exhibit sufficient strength to protect the integrated circuits from external forces such as mechanical and environmental stresses. As device densities increase, high density package designs such as multi-layer structures are becoming increasingly important, which present additional design challenges.

Polymers have emerged as a desirable material for PCB substrates. Polymer substrates exhibit advantages such as flexibility, low cost, light weight and high heat resistance, among other properties. For example, various polymer and carbon materials have been used such as epoxy, phenol and polyimide resins, and the like. Low end organic materials, such as glass reinforced epoxy, have been employed as PCB substrates. However, such materials exhibit poor thermal conductivity and anisotropic thermal expansion. Improved organic materials such as glass reinforced polyimide, cyanate, ester and Teflon show improved temperate stability, but suffer from moisture absorption and poor adhesive strength to copper.

Non-organic PCB substrates are also used. Alumina (ceramic) is widely used and exhibits desirable thermal conductivity and coefficient of thermal expansion (CTE), however such substrates are brittle and costly. Thus it is expected that new materials will continue to be explored as potential candidates for PCB substrates. Irrespective of the PCB substrate used in a particular application, electroplating or electrochemical deposition techniques, particularly electroless plating, have been widely adopted to form metallization layers on the PCB substrates. Copper has become a desired metal for metallization of printed circuit boards (PCB), flexible circuit boards (FCB), multi-chip modules (MCM), and the like, as well as for semiconductor device fabrication, because of its lower resistivity and significantly higher electromigration resistance as compared to aluminum and good thermal conductivity. Copper electro-chemical plating systems have also been developed for semiconductor fabrication of advanced interconnect structures. These methods have involved the following two basic steps: (1) treating the surface of the non-conductive substrate with an agent to make it catalytically receptive to electrolessly formed metal deposits; and (2) electrodepositing a metal over the electrolessly formed conductive metal deposits. The pattern of the printed circuit is achieved through the use of screen printing or photoresist imaging. The non-conductive substrate may initially be copper-clad or not; but most boards have copper cladding at the beginning of the process, which is later removed in the non-pattern areas. Such processes are, consequently, referred to as subtractive.

In the typical processes relevant to printed circuit board manufacture wherein through-hole metallization is employed, the catalytic material most often comprises palladium metal. The process of applying the catalytic material to the substrate surfaces typically involves contact of the substrate with a colloidal solution of palladium and tin compounds. See, e.g., U.S. Pat. Nos. 3,011,920 and 3,532,518. It is generally considered that the tin compounds act as protective colloids for the catalytic palladium. In most cases, the catalysis of the non-conductive substrate of the printed circuit board is followed by an "acceleration" step which exposes or increases exposure of the active catalytic species.

Following deposition of catalyst material on the non-conductive surfaces in the manner described, the surfaces are then contacted with an electroless metal depositing solution in which plating chemical reduction leads to the deposit of metal from the bath onto the catalyzed surface. The through-holes are usually plated with a copper reduction procedure known to the art as electroless copper plating, such as that described by Clyde F. Coombs, Jr. in Printed Circuit Handbook 3rd Edition, McGraw-Hill Book Co., New York, N.Y., 1988, Chapter 12.5, which is incorporated herein by reference in its entirety.

Methods of the type described above, while apparently simple, have proven to be expensive and demanding of strict process controls. Further limitations on the use of these processes result from the chemical susceptibility of the electroless metal layer and by the required use of very hazardous and toxic chemical agents. Efforts to overcome these disadvantages have met with only partial success in the past and have brought with them their own disadvantages. Accordingly, in order to appreciate the significance of the improvements achieved by the present invention it will be helpful to review beforehand the main features of current printed circuit board technology.

In a typical process for the manufacture of a single- or double-sided printed circuit board, suitable substrates typically comprise laminates consisting of two or more foils of copper, which are separated from each other by a layer of non-conductive material. The non-conductive layer or layers are preferably an organic material such as epoxy resin impregnated with glass fibers. Holes are drilled or punched at appropriate locations on the board, providing side-to-side connections when metallized. Thereafter, the board is treated with a cleaning composition, typically alkaline, which removes soils and conditions the through-holes, followed by a slow acid etching process which is used for removal of copper surface pretreatments, oxidation and presentation of uniformly active copper. Typical compositions for this micro-etching step are persulfates and sulfuric acid-hydrogen peroxide solutions. The board is next catalyzed with a neutral or acid solution of tin/palladium catalyst, which deposits a thin layer of surface-active palladium in the through-holes and on the surface of the board. Colloidal tin on the board surfaces and through-holes is removed by treatment with an accelerator composition. The board is then ready for electroless copper plating, which is typically carried out with an alkaline chelated copper reducing solution that deposits a thin copper layer in the through holes and on the surfaces of the board. After acid-dipping, commonly with sulfuric acid, the board is metal plated with a conventional copper plating solution. It is more usual, however, to precede this metallization step with an imaging step.

In a process known as pattern plating, a dry film photoresist is laminated to the board and then exposed to transfer the negative image of the circuit, after which it is developed to remove the unexposed portions. The resist coats the copper that is not part of the conductor pattern. Thickness of the exposed copper pattern is increased by electrolytic copper plating. The imaged dry film resist is then removed, exposing unwanted copper i.e. copper which is not part of the conductor pattern, and said unwanted copper is dissolved with a suitable etchant, e.g., ammoniacal copper or sulfuric acid/peroxide.

A multilayered printed circuit board is made by a similar process, except that pre-formed circuit boards are stacked on top of each other and coated with a dielectric layer. The stack is pressed and bonded together under heat and pressure, after which holes are drilled and plated in the above-described manner. However, one problem present with the manufacture of multilayer printed circuit board through-holes is that the drilling of the holes causes resin "smear" on the exposed conductive copper metal inner layers, due to heating during the drilling operation. The resin smear may act as an insulator between the later plated-on metal in the through holes and these copper inner layers. Thus, this smear may result in poor electrical connections and must be removed before the plating-on operation.

Various alkaline permanganate treatments have been used as standard methods for desmearing surfaces of printed circuit boards, including the through-holes. Such permanganate treatments have been employed for reliably removing wear and drilling debris, as well as for texturing or micro roughening the exposed epoxy resin surfaces. The latter effect significantly improves through-hole metallization by facilitating adhesion to epoxy resin, at the price of roughening the copper and decreasing the frequency response of the copper traces. Other conventional smear removal methods have included treatment with sulfuric acid, chromic acid, and plasma desmear, which is a dry chemical method in which boards are exposed to oxygen and fluorocarbon gases, e.g., CF4. Generally, permanganate treatments involve three different solution treatments used sequentially. They are (1) a solvent swell solution, (2) a permanganate desmear solution, and (3) a neutralization solution. Typically, a printed circuit board is dipped or otherwise exposed to each solution with a deionized water rinse between each of the three treatment solutions.

Electroplating surfaces with copper coatings is generally well known in the industry. Typically, copper electroplating processes use a plating bath/electrolyte including positively charged copper ions in contact with a negatively charged substrate, as a source of electrons, to plate out the copper on the charged substrate. In general, electroplating methods involve passing a current between two electrodes in a plating solution where one electrode is the article to be plated. A common plating solution would be an acid copper plating solution containing (1) a dissolved copper salt (such as copper sulfate), (2) an acidic electrolyte (such as sulfuric acid) in an amount sufficient to impart conductivity to the bath and (3) additives (such as surfactants, brighteners, levelers and suppressants) to enhance the effectiveness and quality of plating. Descriptions of copper plating baths may be found generally in U.S. Pat. Nos. 5,068,013; 5,174,886; 5,051,154; 3,876,513; and 5,068,013.

All electrochemical plating electrolytes have both inorganic and organic compounds at low concentrations. Typical inorganics include copper sulfate ($CuSO_4$), sulfuric acid ($H_2SO_4$), and trace amounts of chloride ($Cl^-$) ions. Typical organics include accelerators, suppressors, and levelers. An accelerator is sometimes called a brightener or anti-suppressor. A suppressor may be a surfactant or wetting agent, and is sometimes called a carrier. A leveler is also called a grain refiner or an over-plate inhibitor.

As described above, most electrochemical plating processes generally require two steps, wherein a seed layer is first formed over the surface of features on the substrate (i.e. the electrodes step, this process may be performed in a separate system), and then the surfaces of the features are exposed to an electrolyte solution while an electrical bias is simultaneously applied between the substrate surface (serving as a cathode) and an anode positioned within the electrolyte solution (i.e. the electroplating or electrodeposition step).

The use of copper however suffers from a number of limitations. For printed circuit board applications, adhesion of copper to polymer PCB substrates is generally weak, thus requiring treatment of the surface of the substrate by a variety of means. For example, surface adhesion may be enhanced by treatments such as oxidation, wet chemical treatment, plasma or UV exposure to roughen the surface of the substrate. As mentioned above, however, one problem present with the manufacture of multilayer printed circuit board through-holes is that the drilling of the holes causes resin "smear" on the exposed conductive copper metal inner layers, due to heating during the drilling operation. The resin smear may act as an insulator between the later plated-on metal in the through holes and these copper inner layers. Thus, this smear may result in poor electrical connections and must be removed before the plating-on operation. Prior art techniques such as different permanganate desmearing and or neutralization compositions and methods have been tried to address this problem. For example, U.S. Pat. No. 4,073,740 to Polichette et al. discloses a composition comprising water, permanganate ion and manganate ion, with a manganate/permanganate molar ratio of up to 1.2 to 1 and a pH of from 11 to 13. U.S. Pat. No. 4,515,829 to Deckart et al discloses contacting through-hole walls with an aqueous alkaline permanganate solution and thereafter a reducing agent solution. U.S. Pat. No. 4,592,852 to Courduvelis et al. teaches the use of an alkaline composition to improve the adhesion of plastics to electroless metal deposits. U.S. Pat. No. 5,015,339 to Pendelton et al. discloses contacting a substrate with an alkaline permanganate solution, and thereafter with a single-step permanganate neutralizer and conditioner composition.

Other teachings in the art have suggested different approaches. For example, U.S. Pat. No. 4,803,097 to Fraenkel et al. discloses first exposing the surfaces of a nonconductive substrate to an atmosphere of ozone, followed by a conditioning solvent of alcohols and strong bases, and then treatment with an oxidizing agent e.g., permanganate. U.S. Pat. No. 4,152,477 to Haruta et al. suggests etching a butadiene composition to expose phenolic resin microcapsules in it, then sensitizing it with palladium chloride. U.S. Pat. No. 4,448,804 to Amelio et al describes treatment with an acidic solution containing a multifunctional ionic copolymer which has good adhesion to the substrate surface. U.S. Pat. No. 5,268,088 to Okabayashi discloses the use of alkaline adhesion promoter solutions comprising aqueous alkali metal salts, e.g., KOH and NaOH. Glass fibers used to impregnate epoxy resin have a highly negative surface charge and repel negatively charged tin-palladium catalyst particles. U.S. Pat. No. 4,976,990 to Bach et al. discloses conditioning agents which improve adsorption of the activating material on the glass fiber, e.g., an organic silicon compound. U.S. Pat. No. 5,342,654 to Koizume et al. discloses a method for surface roughening boards made of polyphenylene sulfide resin by incorporating a specific resin therein and selectively dissolving away the specific resin at the surface.

Electroless plating systems based on palladium and tin chloride catalysts in acidic solutions have become widely used and reported. U.S. Pat. No. 4,478,883 to Bupp et al. describes that a palladium seeding agent may be attracted to the surface of a conductive metals such as copper, resulting in smaller amounts of the palladium catalyst going to desired areas, e.g., when plating through-holes where copper may be present in internal planes of the substrate. U.S. Pat. No. 4,554,182 to Bupp et al. further describes replacing HCl with $H_2SO_4$, apparently eliminating a problem of resist blistering and line tailing. Efforts have been made to replace such highly acidic systems. U.S. Pat. No. 4,634,468 to Gulla et al. discloses a reduced catalytic metal fixed onto an organic suspending agent which serves as a protective colloid, and is preferably a water soluble polymer, e.g., polyacrylamide or polyvinyl pyrrolidone.

Since acidic solutions sometimes cause problems to develop in the copper layer of laminated circuit boards, modifications of the catalytic system have been developed, e.g., a single step method using a variety of different pH colloidal suspensions of both the tin sensitizer and the palladium activator, as disclosed in U.S. Pat. No. 3,011,920 to Shipley, Jr. and U.S. Pat. No. 3,532,518 to D'Ottavio. Another variation of the process is disclosed in U.S. Pat. No. 5,318,803 to Bickford et al., where the catalyzing step is carried out twice, based on redox exchange reactions.

The electroless metal coating, usually copper, functions to make the through-holes conductive for either further electroplating, or for full electroless deposition to the full thickness desired, and to the full surface circuit pattern desired. Where the substrate is non-copper clad initially, the function of the electroless copper is to make the surface conductive as well as the through-holes. The electroless plating step has received abundant treatment in the art. U.S. Pat. No. 4,904,506 to Burnett et al. discloses electroless copper plating in which two successive layers of copper are plated onto the substrate from an alkaline electroless bath, the second bath having higher cyanide ion and $O_2$ concentrations than the first. Current trends in printed circuit board technology indicate that smaller, higher-aspect-ratio holes will become the state of the art. Recently, there has been a substantial decline in the average size of the through-hole in manufactured boards, from 0.030" and larger, to smaller diameters. Such trends place increasing pressure on methodologies for producing printed circuit boards with regard to the always difficult task of properly plating the through-holes.

Direct plating is disclosed in U.S. Pat. No. 4,810,333 to Gulla et al., where the non-conductive substrate is treated with an absorbed colloid surface coating before direct electroplating is carried out. The requirement for relatively high current densities limits this process to plating larger through-holes. Another limitation of past methods has been their lack of adaptability to plating circuit board construction techniques now in use, which are often referred to as photoresist methods. U.S. Pat. No. 4,089,686 to Townsend discloses such a method using a photopolymerizable composition. U.S. Pat. No. 4,948,707 to Johnson et al. discloses a permanent resist material employed over the catalyst layer in a predetermined pattern. However, the layer of catalyzing material beneath the resist layer tends to cause current leakage between circuit lines in close proximity to each other, e.g., in high density circuits. It is taught to insulate the catalyst particles by employing a homogeneous colloidal dispersion of palladium/tin particles, which must then be activated by application of a conventional accelerating solution.

The use of a post-activation or acceleration step prior to the final step of electro-deposition has become widespread. The purpose of this step is to render the activating species deposited in the activation step as "active" as possible prior to immersing the board into the electroless copper bath. Typically, the activating species is palladium, and in order to prevent the palladium from readily oxidizing to a nonactivating form it is combined with from 1 to 10 times as many tin atoms in the stannous state. The post-activation composition, e.g., a strongly acidic or strongly basic solution, removes some of the tin atoms surrounding the palladium, thereby making greater access to the catalyzing palladium by the electroless copper plating solution. Some of the tin and palladium atoms are removed and become dispersed in the post-activation solution, where they combine to form a new and more active species which quickly initiates electroless deposition. The post-activation treatment also serves the function of solubilizing the hydroxides of tin which are formed during the rinse steps which follow activation. The hydroxides of tin form a gelatinous coating on the palladium metal activator particles, which interfere with their proper functioning.

The post-activation or accelerator solutions require close monitoring of their concentrations, treatment times and temperatures, agitation, and accumulating levels of tin and copper, in order to avoid excess removal of tin and palladium. U.S. Pat. No. 5,342,501 to Okabavashi teaches that an accelerator solution can also be a mildly basic or alkaline bath incorporating a small quantity of copper ions. U.S. Pat. No. 4,608,275 to Kukanskis et al discloses agents which oxidize the protective stannous tin and activate the palladium catalyst, e.g., sodium chlorite, hydrogen peroxide, potassium permanganate, and sodium perborate, and suggests use therewith of an electroless nickel bath.

As illustrated by the foregoing, much work has been performed directed to the development and fabrication of printed circuit boards and designs. However, the fabrication steps are often costly and complicated, and improvements are thus highly sought.

Further in all applications, i.e. as a metallization layer in PCB designs and in semiconductor devices, copper tends to plate on local sites of nucleation, resulting in clusters of copper nuclei, copper clusters/crystal, so deposition is not uniform across the substantial or whole surface of the substrate.

Thus, there is a need for additional developments and improvements in the fabrication of PCB's, including for example a metal plating process that can treat the surface of a substrate to promote advantageous binding of metal elements on the surface, and additionally methods to plate a thin copper seed layer directly on printed circuit board substrates capable of uniformly forming metal, such as copper, across the substrate surface and fill features before plating of a bulk metal layer.

SUMMARY OF THE INVENTION

Broadly, embodiments of the present invention provide methods of treating a surface of a substrate. In one particular aspect, embodiments of the present invention provide methods of treating a surface of a substrate that promote binding of one or more metal elements to the surface.

In another aspect, embodiments of the present invention treat the surface of a substrate by thermal reaction with molecules containing reactive groups in an organic solvent or aqueous solution which deposit the molecules onto or attach molecules to conductive, semi-conductive and non-conductive surfaces or substrates.

According to some embodiments of the invention, films are formed on any conducting, semiconductive or non-conductive surface, by thermal reaction of molecules containing reactive groups in an organic solvent or in aqueous solution. The thermal reaction may be produced under a variety of conditions. Methods of the present invention produce organic films attached onto the surface or substrate, the thickness of which is roughly equal to or greater than one molecular monolayer.

Other embodiments of the invention generally relate to the use of these monolayers as a precursor for the deposition or attachment of a metal layer onto a substrate. Particularly, in some embodiments the invention relates to methods and systems for electrochemical deposition or plating of a metal layer on a substrate, and devices formed therefrom.

This is particularly relevant in the electroless plating of conductive metal coatings on selected portions of a non-conductive substrate surface. The final products of these processes are particularly printed circuit boards and related articles. In double sided and multilayer printed circuit boards, it is necessary to provide conductive inter connection between and among the various layers of the board containing conductive circuitry. This is achieved by providing metallized, conductive through-holes in the board requiring electrical connection. The predominant prior art method of providing conductive through-holes is by electroless deposition of metal on the non-conductive through holes drilled or punched through the board. In some embodiments methods of the present invention relate to electroless metallization of non-conductive through-hole surfaces in double-sided and or multilayer oriented circuit boards. The present invention can replace prior art processes of the type described above, with inventive processes that substitute other metallization techniques.

In some embodiments, the present invention broadly provides a printed circuit board, comprising: at least one substrate; a layer of organic molecules attached to the at least one substrate; and a metal layer atop said layer of organic molecules.

In another aspect, embodiments of the present invention provide for additional cleaning, baking, etching, chemical oxidation or other pre-treatment of the surface prior to the deposition or attachment of the molecule to enhance the deposition or attachment of the molecule, the reaction of the molecule to the surface, or the ability of the surface to bond with the molecules as deposited.

In other aspects, embodiments of the present invention provide methods of direct electroplating of copper on substrates without formation of a copper seed layer. Embodiments also provide structures or films of organic molecular layers that promote favorable deposition or attachment of metal elements onto substrates in electroplating processes.

In further aspects, a printed circuit board is provided comprising a polymer material, such as an epoxy, which may contain a substantial amount of a filler material, such as glass, silica, or other materials, modified on its surface with a chemical adhesive material, such as a porphyrin, that alters its chemical affinity for a metal, such as copper, in order to facilitate strong adhesion between the polymer composite and the metal layer. A second layer of the chemical adhesive layer may be applied to the metal (copper) surface, to promote adhesion between it and subsequent polymer (epoxy/glass) layers. In these embodiments, the PCB may be a multilayer conductive structure.

Of further advantage, embodiments of the present invention provide methods of selectively depositing materials on a surface or substrate by selectively contacting molecules on the surface to form regions, or patterned regions, which are then processed to form selective areas of copper or other metals thereon. In this case, the adhesive molecular layer is either contacted to specific regions of the substrate, using photoresist and optical lithography, as is conventionally used in the art, or it is applied to the entire surface and selectively activated. This can be accomplished by photoactivation through a lithographic process, ion beam activation or any other technique that can provide adequate spatial imaging of a surface.

Additionally, embodiments of the present invention provide methods of forming ordered molecule assemblies on a surface or substrate which is subsequently plated with a metal element, such as copper and the like. For example, in one illustrative embodiment, methods of the present invention promote metal binding to a substrate, characterized in that: a surface of a substrate is treated with an organic molecule comprised of a thermally stable base, one or more binding groups configured to promote binding with the metal and one or more attachment groups configured to attach to the organic molecule to the surface.

Embodiments of the present invention further provide kits comprising one or more heat resistance organic molecules derivatized with one or more attachment groups and instruction materials for carrying out a process of depositing said molecules on a surface or substrate.

BRIEF DESCRIPTION OF THE FIGURES

The foregoing and other aspects of the present invention will be apparent upon consideration of the following detailed description, taken in conjunction with the accompanying drawings, in which like reference characters refer to like parts throughout, and in which.

DESCRIPTION OF THE INVENTION

It is to be understood that both the foregoing general description and the following description are exemplary and explanatory only and are not restrictive of the methods and devices described herein. In this application, the use of the singular includes the plural unless specifically state otherwise. Also, the use of "or" means "and/or" unless state otherwise. Similarly, "comprise," "comprises," "comprising," "include," "includes" "including" "has" and "having" are not intended to be limiting.

The present invention provides a process for attaching and growing a film of an organic molecular layer on(to) a variety of surfaces, which constitutes a solution to the above mentioned problems of the prior art. This film has the property that it stabilizes the deposition of elements used for electroplating (e.g., Cu, Ni, Pd) and provides a more suitable substrate for electroplating than the original surface.

In some embodiments, methods of the present invention are performed by thermally-induced reaction of at least one thermally-stable molecular species that is a precursor of the said organic film, comprising the steps of attaching and growing the film by contacting the molecular species with a surface, either in solution or via chemical vapor deposition, heating the surface to induce a chemical reaction which binds the molecule to the surface, then washing off the excess through addition and removal of a solvent which can dissolve the unreacted molecules. This is followed by electroplating the desired metal utilizing conventional procedures. The attached molecule stabilizes the metal ion on the surface and promotes electroplating.

In one embodiment, the invention provides methods for attaching molecular species to electronic material surfaces. In some embodiments the molecules include porphyrins and related species. The electronic materials include but are not limited to: silicon, silicon oxide, silicon nitride, metals, metal oxides, metal nitrides and printed circuit board substrates, including carbon-based materials such as polymers and epoxies. The attachment procedure is simple, can be completed in short times, requires minimal amounts of material, is compatible with diverse molecular functional groups, and in some instances affords unprecedented attachment motifs. These features greatly enhance the integration of the molecular materials into the processing steps that are needed to complete the plating process.

In one embodiment, this invention provides a method of coupling an organic molecule to a surface of a Group II, III, IV, V, or VI element or to a semiconductor comprising a Group II, III, IV, V, or VI element (more preferably to a material comprising a Group III, IV, or V element) or to a transition metal, transition metal oxide or nitride and/or to an alloy comprising a transition metal or to another metal.

Figure 1:
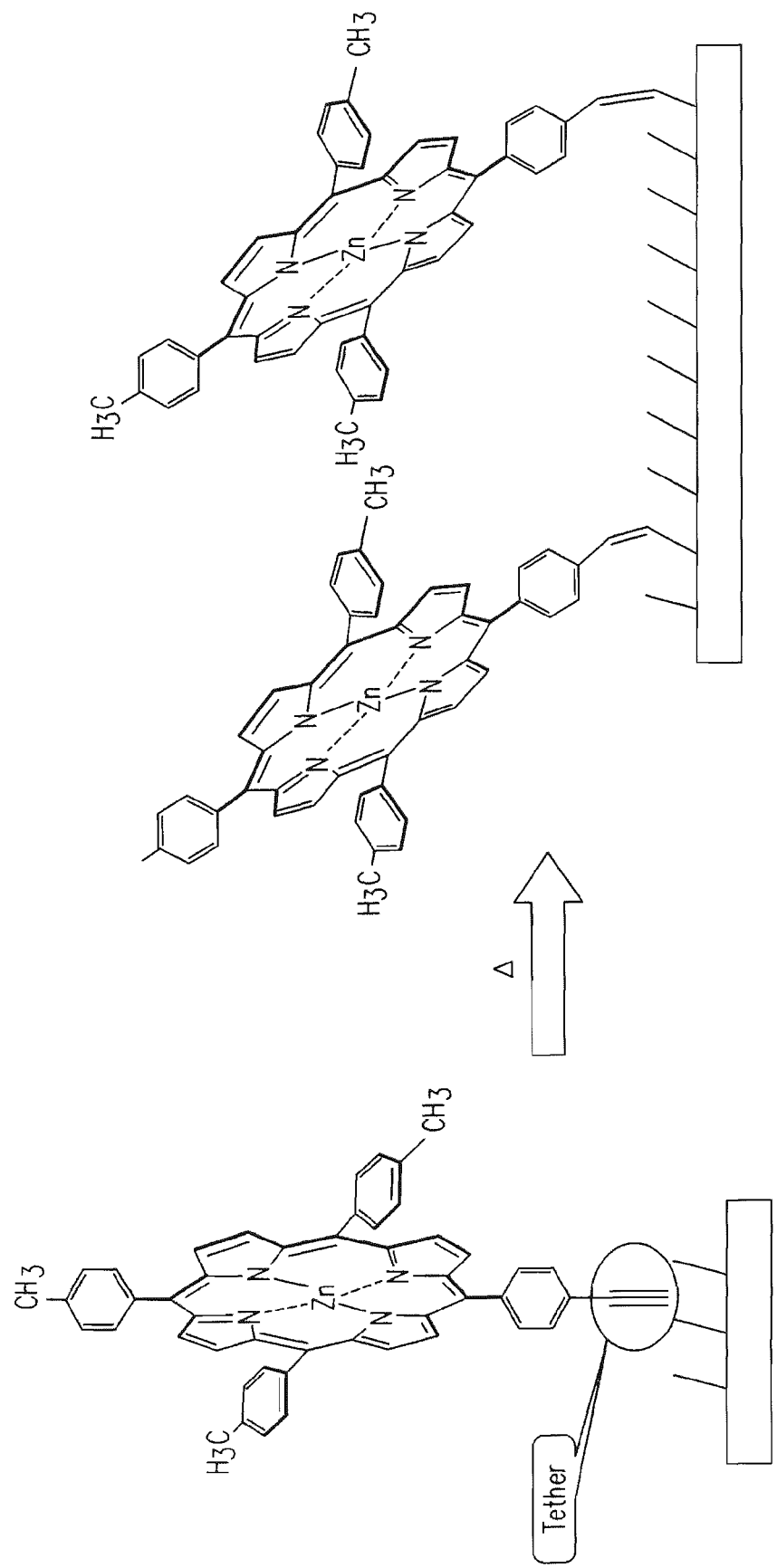
FIG. 1 shows an exemplary reaction scheme for reaction of a surface according to one embodiment of the method of the present invention.

In certain embodiments, as illustrated generally in FIG. 1, the present invention provides methods of coupling a molecule to a surface where the method includes providing one or more heat-resistant organic molecules bearing an attachment group; heating the molecule(s) or mixture of different molecules and/or the surface to a temperature of at least about 50° C.; and contacting the molecule(s) to the surface whereby the molecule(s) form a linkage to the surface. In certain embodiments, the organic molecule(s) are electrically coupled to the surface. In other embodiments the molecules are covalently linked to the surface. The method can, optionally, be performed under an inert atmosphere (e.g. Ar, $N_2$). In certain embodiments, the heating comprises heating the molecule(s) to a gas phase and the contacting comprises contacting the gas phase to the surface. In certain embodiments, the heating comprises heating the molecule(s) and/or the surface while the molecule is in contact with the surface. In certain embodiments, the heating comprises applying the molecule(s) to the surface and then simultaneously or subsequently heating the molecule(s) and/or surface. The organic molecule(s) can be provided in a solvent or dry, or in gas phase, or otherwise not in a solvent. The molecule(s) can be placed into contact with the surface by dipping in a solution of the molecule, spraying a solution of the molecule, ink-jet printing, or vapor deposition of the molecule directly onto the surface, and the like. Of one particular advantage, the method of the present invention is suited for coating non-planar substrates and surfaces. For example, the organic molecules (s) may be attached to curved or other non-planar surfaces and substrates.

In certain embodiments, the heating is to a temperature of at least about 25° C., preferably at least about 50° C., more preferably at least about 100° C., and most preferably at least about 150° C. Heating can be accomplished by any convenient method, e.g. in an oven, on a hot plate, in a CVD device, in an MBE device, and the like. In some embodiments the surface comprises PCB substrates such as polymer and carbon materials, including but not limited to epoxy, glass reinforced epoxy, phenol, polyimide resins glass reinforced polyimide, cyanate, esters, Teflon, and the like. In other embodiments, the surface comprises a material selected from the group consisting of a Group III element, a Group IV element, a Group V element, a semiconductor comprising a Group III element, a semiconductor comprising a Group IV element, a semiconductor comprising a Group V element, a transition metal, and a transition metal oxide. Certain preferred surfaces comprise one or more of the following: Ga, Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, W, Mo, and oxides, alloys, mixtures, and/or nitrides thereof. In certain embodiments, the surface comprises a Group III, IV, or V, and/or a doped Group III, IV, or V element, e.g. silicon, germanium, doped silicon, doped germanium, and the like. The surface can, optionally, be a hydrogen passivated surface.

In general, in some embodiments the organic molecule is comprised of a thermally stable unit or base with one more binding groups X and one or more attachment groups Y. In certain embodiments, the organic molecule is heat-resistant metal-binding molecule, and may be comprised of one or more "surface active moieties," also referred to in associated applications as "redox active moieties" or "ReAMs". One embodiment of the invention encompasses the use of compositions of molecular components using surface active moieties generally described in U.S. Pat. Nos. 6,208,553, 6,381,169, 6,657,884, 6,324,091, 6,272,038, 6,212,093, 6,451,942, 6,777,516, 6,674,121, 6,642,376, 6,728,129, US Publication Nos: 20070108438, 20060092687, 20050243597, 20060209587 20060195296 20060092687 20060081950 20050270820 20050243597 20050207208 20050185447 20050162895 20050062097 20050041494 20030169618 20030111670 20030081463 20020180446 20020154535 20020076714, 2002/0180446, 2003/0082444, 2003/0081463, 2004/0115524, 2004/0150465, 2004/0120180, 2002/010589, U.S. Ser. No. 10/766,304, Ser. No. 10/834,630, Ser. No. 10/628,868, Ser. No. 10/456,321, Ser. No. 10/723,315, Ser. No. 10/800,147, Ser. No. 10/795,904, Ser. No. 10/754,257, 60/687,464, all of which are expressly incorporated in their entirety. Note that while in the associated applications listed immediately above, the heat-resistant molecule is sometime referred to as "redox active moieties" or "ReAMs," in the instant application term surface active moiety is more appropriate. In general, in some embodiments there are several types of surface active moieties useful in the present invention, all based on polydentate proligands, including macrocyclic and non-macrocyclic moieties. A number of suitable proligands and complexes, as well as suitable substituents, are outlined in the references cited above. In addition, many polydentate proligands can include substitution groups (often referred to as "R" groups herein and within the cited references, and include moieties and definitions outlined in U.S. Pub. No. 2007/0108438, incorporated by reference herein specifically for the definition of the substituent groups.

Suitable proligands fall into two categories: ligands which use nitrogen, oxygen, sulfur, carbon or phosphorus atoms (depending on the metal ion) as the coordination atoms (generally referred to in the literature as sigma (a) donors) and organometallic ligands such as metallocene ligands (generally referred to in the literature as pi donors, and depicted in U.S. Pub. No. 2007/0108438 as Lm).

In addition, a single surface active moiety may have two or more redox active subunits, for example, as shown in FIG. 13A of U.S. Pub. No. 2007/0108438, which utilizes porphyrins and ferrocenes.

In some embodiments, the surface active moiety is a macrocyclic ligand, which includes both macrocyclic proligands and macrocyclic complexes. By "macrocyclic proligand" herein is meant a cyclic compound which contain donor atoms (sometimes referred to herein as "coordination atoms") oriented so that they can bind to a metal ion and which are large enough to encircle the metal atom. In general, the donor atoms are heteroatoms including, but not limited to, nitrogen, oxygen and sulfur, with the former being especially preferred. However, as will be appreciated by those in the art, different metal ions bind preferentially to different heteroatoms, and thus the heteroatoms used can depend on the desired metal ion. In addition, in some embodiments, a single macrocycle can contain heteroatoms of different types.

A "macrocyclic complex" is a macrocyclic proligand with at least one metal ion; in some embodiments the macrocyclic complex comprises a single metal ion, although as described below, polynucleate complexes, including polynucleate macrocyclic complexes, are also contemplated.

A wide variety of macrocyclic ligands find use in the present invention, including those that are electronically conjugated and those that may not be. A broad schematic of a suitable macrocyclic ligand is shown and described in FIG. 15 of U.S. Pub. No. 2007/0108438. In some embodiments, the rings, bonds and substitutents are chosen to result in the compound being electronically conjugated, and at a minimum to have at least two oxidation states.

In some embodiments, the macrocyclic ligands of the invention are selected from the group consisting of porphyrins (particularly porphyrin derivatives as defined below), and cyclen derivatives. A particularly preferred subset of macrocycles suitable in the invention are porphyrins, including porphyrin derivatives. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, (3- or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Additional suitable porphyrin derivatives include, but are not limited to the chlorophyll group, including etiophyllin, pyrroporphyrin, rhodoporphyrin, phylloporphyrin, phylloerythrin, chlorophyll a and b, as well as the hemoglobin group, including deuteroporphyrin, deuterohemin, hemin, hematin, protoporphyrin, mesohemin, hematoporphyrin mesoporphyrin, coproporphyrin, uruporphyrin and turacin, and the series of tetraarylazadipyrromethines.

As will be appreciated by those in the art, each unsaturated position, whether carbon or heteroatom, can include one or more substitution groups as defined herein, depending on the desired valency of the system.

In addition, included within the definition of "porphyrin" are porphyrin complexes, which comprise the porphyrin proligand and at least one metal ion. Suitable metals for the porphyrin compounds will depend on the heteroatoms used as coordination atoms, but in general are selected from transition metal ions. The term "transition metals" as used herein typically refers to the 38 elements in groups 3 through 12 of the periodic table. Typically transition metals are characterized by the fact that their valence electrons, or the electrons they use to combine with other elements, are present in more than one shell and consequently often exhibit several common oxidation states. In certain embodiments, the transition metals of this invention include, but are not limited to one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, palladium, gold, mercury, rutherfordium, and/or oxides, and/or nitrides, and/or alloys, and/or mixtures thereof.

Figure 17:
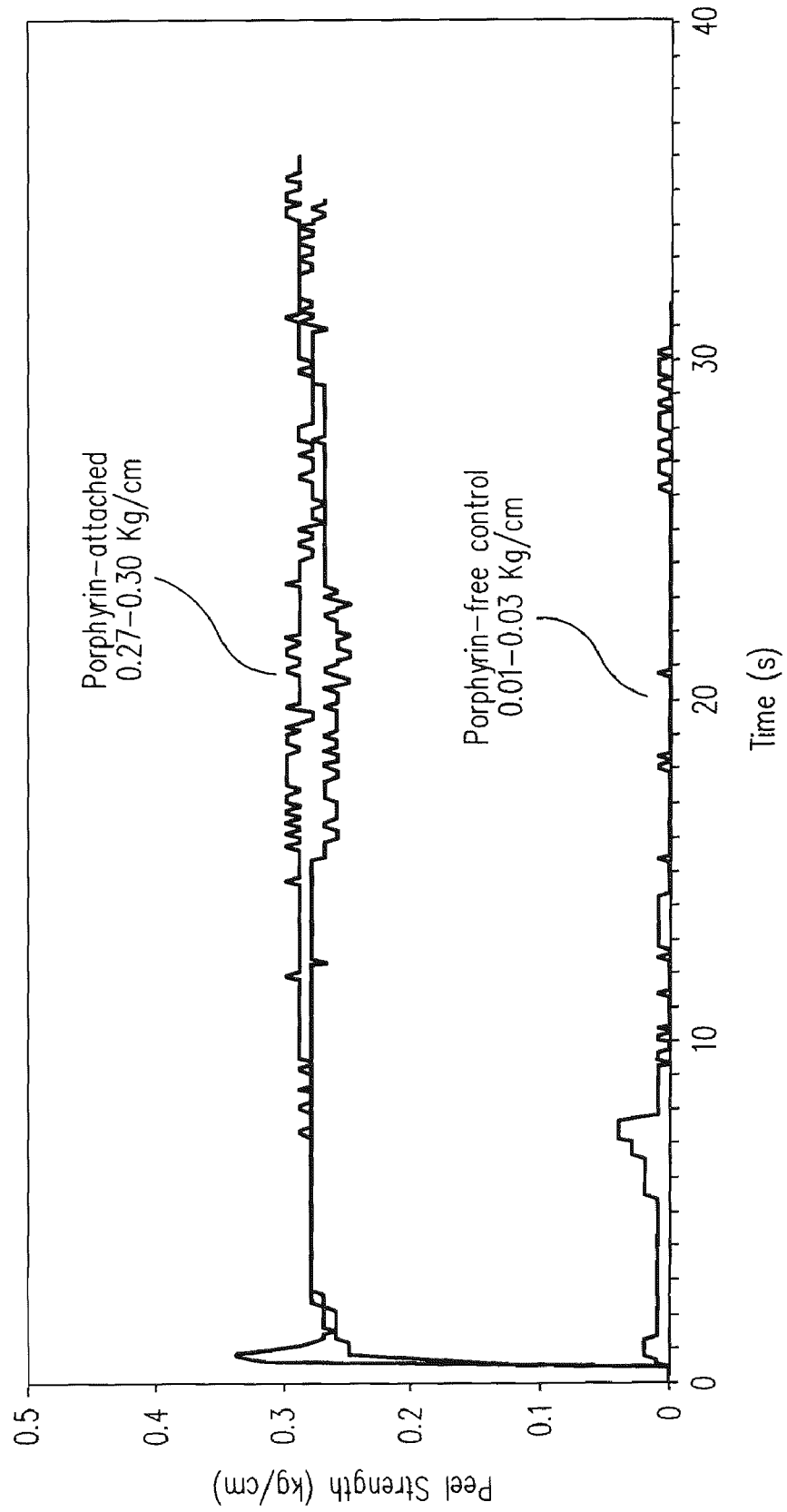
FIG. 17 graphically depicts peel strength as a function of time for substrates prepared according to embodiments of the present invention and compared to that prepared conventionally, and demonstrates the enhancement of peel strength of electrolytic Cu by porphyrin molecules formed on surfaces according to methods of the present invention.

There are also a number of macrocycles based on cyclen derivatives. FIGS. 17 13C of U.S. Pub. No. 2007/0108438, depicts a number of macrocyclic proligands loosely based on cyclen/cyclam derivatives, which can include skeletal expansion by the inclusion of independently selected carbons or heteroatoms. In some embodiments, at least one R group is a surface active subunit, preferably electronically conjugated to the metal. In some embodiments, including when at least one R group is a surface active subunit, two or more neighboring R2 groups form cyclo or an aryl group. In the present invention, the at least on R group is a surface active subunit or moiety.

Furthermore, in some embodiments, macrocyclic complexes relying organometallic ligands are used. In addition to purely organic compounds for use as surface active moieties, and various transition metal coordination complexes with 8-bonded organic ligand with donor atoms as heterocyclic or exocyclic substituents, there is available a wide variety of transition metal organometallic compounds with pi-bonded organic ligands (see Advanced Inorganic Chemistry, 5th Ed., Cotton & Wilkinson, John Wiley & Sons, 1988, chapter 26; Organometallics, A Concise Introduction, Elschenbroich et al., 2nd Ed., 1992, 30 VCH; and Comprehensive Organometallic Chemistry II, A Review of the Literature 1982-1994, Abel et al. Ed., Vol. 7, chapters 7, 8, 1.0 & 11, Pergamon Press, hereby expressly incorporated by reference). Such organometallic ligands include cyclic aromatic compounds such as the cyclopentadienide ion [$C_5H_5(-1)$] and various ring substituted and ring fused derivatives, such as the indenylide(−1) ion, that yield a class of bis(cyclopentadieyl)metal compounds, (i.e. the metallocenes); see for example Robins et al., J. Am. Chem. Soc. 104:1882-1893 (1982); and Gassman et al., J. Am. Chem. Soc. 108:4228-4229 (1986), incorporated by reference. Of these, ferrocene [$(C_5H_5)_2Fe$] and its derivatives are prototypical examples which have been used in a wide variety of chemical (Connelly et al., Chem. Rev. 96:877-910 (1996), incorporated by reference) and electrochemical (Geiger et al., Advances in Organometallic Chemistry 23:1-93; and Geiger et al., Advances in Organometallic Chemistry 24:87, incorporated by reference) reactions. Other potentially suitable organometallic ligands include cyclic arenes such as benzene, to yield bis(arene)metal compounds and their ring substituted and ring fused derivatives, of which bis(benzene)chromium is a prototypical example, Other acyclic n-bonded ligands such as the allyl(−1) ion, or butadiene yield potentially suitable organometallic compounds, and all such ligands, in conjunction with other 7c-bonded and 8-bonded ligands constitute the general class of organometallic compounds in which there is a metal to carbon bond. Electrochemical studies of various dimers and oligomers of such compounds with bridging organic ligands, and additional non-bridging ligands, as well as with and without metal-metal bonds are all useful.

In some embodiments, the surface active moieties are sandwich coordination complexes. The terms "sandwich coordination compound" or "sandwich coordination complex" refer to a compound of the formula L-Mn-L, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) Chemical Society Reviews 26: 433-442) incorporated by reference. Sandwich coordination complexes include, but are not limited to "double-decker sandwich coordination compound" and "triple-decker sandwich coordination compounds". The synthesis and use of sandwich coordination compounds is described in detail in U.S. Pat. Nos. 6,212,093; 6,451,942; 6,777,516; and polymerization of these molecules is described in WO 2005/086826, all of which are included herein, particularly the individual substitutent groups that find use in both sandwich complexes and the "single macrocycle" complexes.

In addition, polymers of these sandwich compounds are also of use; this includes "dyads" and "triads" as described in U.S. Pat. Nos. 6,212,093; 6,451,942; 6,777,516; and polymerization of these molecules as described in WO 2005/086826, all of which are incorporated by reference and included herein.

Surface active moieties comprising non-macrocyclic chelators are bound to metal ions to form non-macrocyclic chelate compounds, since the presence of the metal allows for multiple proligands to bind together to give multiple oxidation states.

In some embodiments, nitrogen donating proligands are used. Suitable nitrogen donating proligands are well known in the art and include, but are not limited to, NH2; NFIR; NRR'; pyridine; pyrazine; isonicotinamide; imidazole; bipyridine and substituted derivatives of bipyridine; terpyridine and substituted derivatives; phenanthrolines, particularly 1,10-phenanthroline (abbreviated phen) and substituted derivatives of phenanthrolines such as 4,7-dimethylphenanthroline and dipyridol[3,2-a:2',3'-c]phenazine (abbreviated dppz); dipyridophenazine; 1,4,5,8,9,12-hexaazatriphenylene (abbreviated hat); 9,10-phenanthrenequinone diimine (abbreviated phi); 1,4,5,8-tetraazaphenanthrene (abbreviated tap); 1,4,8,11-tetra-azacyclotetradecane (abbreviated cyclam) and isocyanide. Substituted derivatives, including fused derivatives, may also be used. It should be noted that macrocylic ligands that do not coordinatively saturate the metal ion, and which require the addition of another proligand, are considered non-macrocyclic for this purpose. As will be appreciated by those in the art, it is possible to covalent attach a number of "non-macrocyclic" ligands to form a coordinatively saturated compound, but that is lacking a cyclic skeleton.

Suitable sigma donating ligands using carbon, oxygen, sulfur and phosphorus are known in the art. For example, suitable sigma carbon donors are found in Cotton and Wilkenson, Advanced Organic Chemistry, 5th Edition, John Wiley & Sons, 1988, hereby incorporated by reference; see page 38, for example. Similarly, suitable oxygen ligands include crown ethers, water and others known in the art. Phosphines and substituted phosphines are also suitable; see page 38 of Cotton and Wilkenson.

The oxygen, sulfur, phosphorus and nitrogen-donating ligands are attached in such a manner as to allow the heteroatoms to serve as coordination atoms.

In addition, some embodiments utilize polydentate ligands that are polynucleating ligands, e.g. they are capable of binding more than one metal ion. These may be macrocyclic or non-macrocyclic.

The molecular elements herein may also comprise polymers of the surface active moieties as outlined above; for example, porphyrin polymers (including polymers of porphyrin complexes), macrocycle complex polymers, Surface active moieties comprising two surface active subunits, etc. can be utilized. The polymers can be homopolymers or heteropolymers, and can include any number of different mixtures (admixtures) of monomeric surface active moiety, wherein "monomer" can also include surface active moieties comprising two or more subunits (e.g. a sandwich coordination compound, a porphyrin derivative substituted with one or more ferrocenes, etc.). Surface active moiety polymers are described in WO 2005/086826, which is expressly incorporated by reference in its entirety.

In certain embodiments, the attachment group(s) Y of the surface active moiety comprises an aryl functional group and/or an alkyl attachment group. In certain embodiments, the aryl functional group comprises a functional group selected from the group consisting of amino, alkylamino, bromo, iodo, hydroxy, hydroxymethyl, formyl, bromomethyl, vinyl, allyl, S-acetylthiomethyl, Se-acetylselenomethyl, ethynyl, 2-(trimethylsilyl)ethynyl, mercapto, mercaptomethyl, 4,4,5,5-tetramethyl-1,3,2-dioxaborolan-2-yl, and dihydroxyphosphoryl. In certain embodiments, the alkyl attachment group comprises a functional group selected from the group consisting of bromo, iodo, hydroxy, formyl, vinyl, mercapto, selenyl, S-acetylthio, Se-acetylseleno, ethynyl, 2-(trimethylsilyl)ethynyl, 4,4,5,5-tetramethyl-1,3,2-dioxaborolan-2-yl, and dihydroxyphosphoryl. In certain embodiments, the attachment group comprises an alcohol or a phosphonate.

In certain embodiments, the contacting comprises selectively contacting the organic molecule to certain regions of the surface and not to other regions. For example, the contacting comprises placing a protective coating (e.g. a masking material) on the surface in regions where the organic molecule(s) are not to be attached; contacting the molecule(s) with the surface; and removing the protective coating to provide regions of the surface without the organic molecule(s). In certain embodiments, the contacting comprises contact printing of a solution comprising the organic molecule(s) or the dry organic molecule(s) onto the surface. In certain embodiments, the contacting comprises spraying or dropping a solution comprising the organic molecule(s) or applying the dry organic molecule(s) onto the surface. In certain embodiments, the contacting comprises contacting the surface with the molecule(s) and subsequently etching selected regions of the surface to remove the organic molecule(s). In certain embodiments, the contacting comprises molecular beam epitaxy (MBE), and/or chemical vapor deposition (CVD), atomic layer deposition (ALD), molecular layer deposition (MLD) and/or plasma-assisted vapor deposition, and/or sputtering and the like. In certain embodiments, the heat-resistant organic molecule comprises a mixture at least two different species of heat-resistant organic molecule and the heating comprises heating the mixture and/or the surface.

This invention also provides a method of coupling a metal-binding molecule (or a collection of different species of metal-binding molecules) to a surface. In some embodiments the method comprises heating the molecule(s) to a gas phase; and contacting the molecule(s) to a surface whereby the metal-binding molecule(s) couple to the surface. In certain embodiments, the metal-binding molecule is chemically coupled to the surface and/or electrically coupled to the surface. In certain embodiments, the heating is to a temperature of at least about 25° C., preferably at least about 50° C., more preferably at least about 100° C., and most preferably at least about 150° C. Heating can be accomplished by any convenient method, e.g. in an oven, on a hot plate, in a CVD device, in an MBE device, and the like.

In certain embodiments, the surface is comprised a material selected from the group of a Group III element, a Group IV element, a Group V element, a semiconductor comprising a Group III element, a semiconductor comprising a Group IV element, a semiconductor comprising a Group V element, a transition metal, a transition metal oxide, a plastic material, epoxy, ceramic, carbon and the like as described above. In certain embodiments, the surface comprises a material such as Au, Ag, Cu, Al, Ta, Ti, Ru, Ir, Pt, Pd, Os, Mn, Hf, Zr, V, Nb, La, Y, Gd, Sr, Ba, Cs, Cr, Co, Ni, Zn, Ga, In, Cd, Rh, Re, W, Mo, and/or oxides, nitrides, mixtures, or alloys thereof. In certain embodiments, the metal-binding molecule includes, but is not limited to any of the molecules described herein. Similarly the attachment groups include, but are not limited to any of the attachment groups described herein. In certain embodiments, the Group II, III, IV, V, or VI element, more preferably a Group III, IV, or V, element, still more preferably a Group IV element or a doped Group IV element (e.g., silicon, germanium, doped silicon, doped germanium, etc.). In certain embodiments, the contacting comprises selectively contacting the volatilized organic molecule to certain regions of the surface and not to other regions. In certain embodiments, the contacting comprises: placing a protective coating on the surface in regions where the metal-binding molecule is not to be attached; contacting the molecule with the surface; and removing the protective coating to provide regions of the surface without the metal-binding molecule. In certain embodiments, the contacting comprises contacting the surface with the molecule and subsequently etching selected regions of the surface to remove the metal-binding molecule. In certain embodiments, the contacting comprises molecular beam epitaxy (MBE), and/or chemical vapor deposition (CVD), and/or plasma-assisted vapor deposition, and/or sputtering, and the like.

In another embodiment, this invention provides a surface of a Group II, III, IV, V, or VI element or a surface of a semiconductor comprising a Group II, III, IV, V, or VI or a transition metal, transition metal oxide, or nitride, or alloy, or mixture having an organic molecule coupled thereto, where the organic molecule is coupled to said surface by methods described herein. In certain embodiments, the organic molecule is a metal-binding molecule and includes, but is not limited to any of the molecules described herein. Similarly the attachment groups include, but are not limited to any of the attachment groups described herein. In certain embodiments, the Group II, III, IV, V, or VI element, more preferably a Group III, IV, or V, element, still more preferably a Group IV element or a doped Group IV element (e.g., silicon, germanium, doped silicon, doped germanium, etc.).

Figure 2:
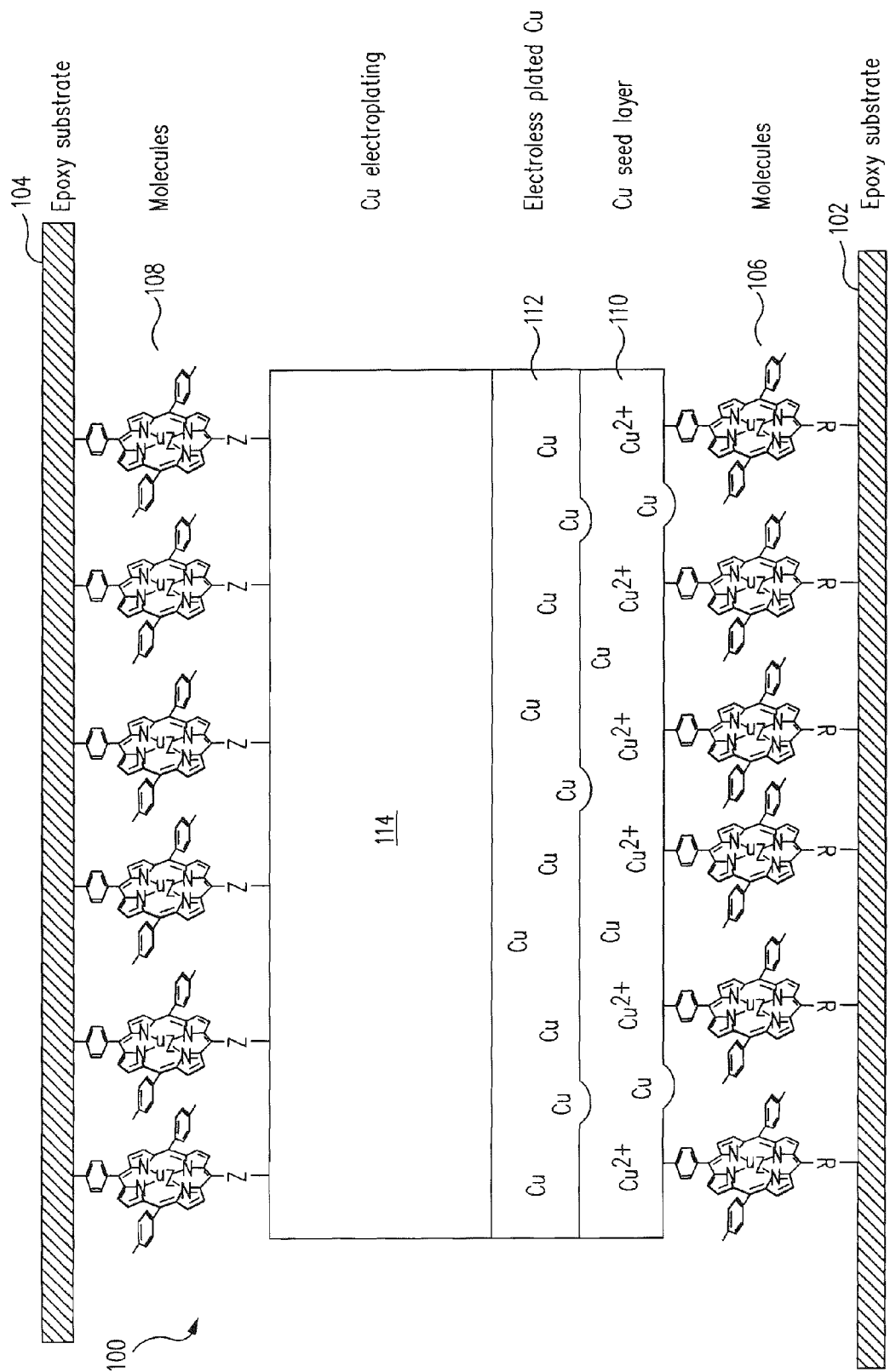
FIG. 2 illustrates a simplified schematic diagram of a device showing various components according to one embodiment of the present invention.

In another embodiment, this invention provides a method of fabricating an ordered molecular assembly for use in metal plating as illustrated in FIG. 2. In particular, FIG. 2 illustrates a simplified schematic of a double sided device 100 having two epoxy substrates 102 and 104. In the exemplary embodiment, a layer of organic molecules 106 and 108 are coupled to the surface of each epoxy substrate 102 and 104 and form an interface for copper plating or binding. A copper seed layer 110 is formed on one of the layers of organic molecules. Formed atop the copper seed layer 110 is a electroless plated copper 112, followed by bulk copper 114 typically formed by electroplating. The copper layers are sandwiched between the two epoxy substrates. While one particular arrangement is shown in FIG. 2, many other devices with different arrangement of layers, single sided devices, devices with vias, and the like, are all within the spirit and scope of the invention. In some embodiments, the method generally involves providing a heat-resistant organic molecule (or a plurality of different heat resistant organic molecules) derivatized with an attachment group; heating the molecule and/or a surface to a temperature of at least about 100 C; where the surface comprises a PCB substrates such as polymer and other organic materials, including but not limited to epoxy, glass reinforced epoxy, phenol, polyimide resins glass reinforced polyimide, cyanate, esters, Teflon, or a Group III, IV, or V element or a transition metal or metal oxide; contacting the molecule(s) at a plurality of discrete locations on the surface whereby the attachment groups form bonds (such as but not limited to covalent or ionic bonds) with the surface at the plurality of discrete locations. In certain embodiments, the heating is to a temperature of at least about 25° C. but below the decomposition temperature of the system components, preferably at least about 50° C., more preferably at least about 100° C., and most preferably at least about 150° C. In certain embodiments, the organic molecule is a metal-binding molecule and includes, but is not limited to any of the molecules described herein. Similarly the attachment groups include, but are not limited to any of the attachment groups described herein.

This invention also provide kits for coupling an organic molecule to the surface of a type III, IV, or V material or a transition metal or transition metal oxide. The kits typically include a container containing a heat-resistant organic molecule derivatized with an attachment group (e.g., as described herein) and, optionally, instructional materials teaching coupling the organic molecule to the surface by heating the molecule and/or the surface to a temperature of about 100 C, or more.

The methods of the present invention are suited to treating non-conductive surfaces (such as epoxy, glass, $SiO_2$, SiN etc) as well as conductive surfaces, such as copper, gold, platinum, etc., and to "non-noble" surfaces, such as surfaces containing reducible oxide, a graphite surface, a conductive or semiconductive organic surface, a surface of an alloy, a surface of one (or more) conventional conductive polymer(s), such as a surface based on pyrrole, on aniline, on thiophene, on EDOT, on acetylene or on polyaromatics, etc., a surface of an intrinsic or doped semiconductor, and any combination of these compounds.

Mixtures of these various molecular compounds may also be used according to the present invention.

In addition, methods of the present invention make it possible to manufacture organic films that can simultaneously provide protection against the external medium, for example against corrosion, and/or offer an attached coating that has organic functional groups such as those mentioned above and/or promote or maintain electrical conductivity at the surface of the treated objects.

It is thus also possible, by methods of the present invention, to manufacture multilayer conductive structures, for example by using organic intercalating films based on the present invention.

In some embodiments, the organic films obtained according to the present invention constitute an attached protective coating, which withstands anodic potentials above the corrosion potential of the conductive surface to which they have been attached.

Methods of the present invention may thus also comprise, for example, a step of depositing a film of a vinyl polymer by thermal polymerization of the corresponding vinyl monomer on the conductive polymer film.

Methods of the present invention may also be used to produce very strong organic/conductor interfaces. Specifically, the organic films of the present invention are conductive at any thickness. When they are sparingly crosslinked, they can constitute "conductive sponges", with a conductive surface whose apparent area is very much greater than the original surface onto which they are attached. This makes it possible to produce a much more dense functionalization than on the starting surface onto which they are attached.

The present invention consequently makes it possible to produce attached and conductive organic coatings, of adjustable thickness, on conductive or semiconductive surfaces.

Methods of the present invention can be used, for example, to protect non-noble metals against external attack, such as those produced by chemical agents, such as corrosion, etc. This novel protection imparted by means of the invention can, for example, prove to be particularly advantageous in connections or contacts, where the electrical conduction properties are improved and/or conserved.

In another application, methods of the present invention can be used, for example, for the manufacture of covering attached sublayers, on all types of conductive or semiconductive surfaces, on which all types of functionalizations may be performed, and especially those using electrochemistry, for instance the electro-deposition or electro-attaching of vinyl monomers, of strained rings, of diazonium salts, of carboxylic acid salts, of alkynes, of Grignard derivatives, etc. This sublayer can thus constitute a high-quality finishing for the remetallization of objects, or to attach functional groups, for example in the fields of biomedics, biotechnology, chemical sensors, instrumentation, etc.

The present invention may thus be used, for example, in the manufacture of an encapsulating coating for electronic components, in the manufacture of a hydrophilic coating, in the manufacture of a biocompatible coating, for the manufacture of a film that can be used as an adhesion primer, as an organic post-functionalization support, as a coating with optical absorption properties or as a coating with stealth properties.

Of particular advantage the present invention may be used to provide a molecular adhesion layer for electroless deposition and/or electroplating of metals. In one instance, molecules are attached to printed circuit board substrates, such as polymer, epoxy or carbon coated substrates to provide a seed layer for electroless plating of a metal, such as electroless copper plating. According to teaching of the present invention, such molecules exhibit a strong bond to the organic substrate, and/or a strong organic-Cu bond. In some embodiments the molecules exhibit a covalent bond. The high affinity of the attached molecule facilitates electroless plating of the copper, which is then used as a seed layer to electroplate larger quantities of copper. Adhesion layers can be used on a wide number of substrates for a variety of purposes, such as silicon substrates used in solar energy devices to allow electroplating of a metal layer; through-hole vias on a semiconductor device to allow metal connection(s) between adjacent surfaces and devices; the backside of semiconductor parts, to allow deposition of metal layers, which can subsequently be used to form capacitors; packaging substrates, to allow deposition of metal layers for patterning and interconnects; as well as many types of flexible organic substrates to allow the deposition of metal layers.

According to some embodiments, after formation of defined structures on the substrate, electroless plating is used to form a first metallic coating over the substrate surfaces and electrolytic copper deposition is then used to enhance the thickness of the coating. Alternatively, electrolytic copper may be plated directly over a suitably prepared microvia as disclosed in any of U.S. Pat. Nos. 5,425,873; 5,207,888; and 4,919,768. The next step in the process comprises electroplating copper onto the thus prepared conductive microvias using an electroplating solution of the invention. A wide variety of substrates may be plated with the compositions of the invention, as discussed above. The compositions of the invention are particularly useful to plate difficult work pieces, such as circuit board substrates with small diameter, high aspect ratio microvias and other apertures. The plating compositions of the invention also will be particularly useful for plating integrated circuit devices, such as formed semiconductor devices and the like.

Figure 3:
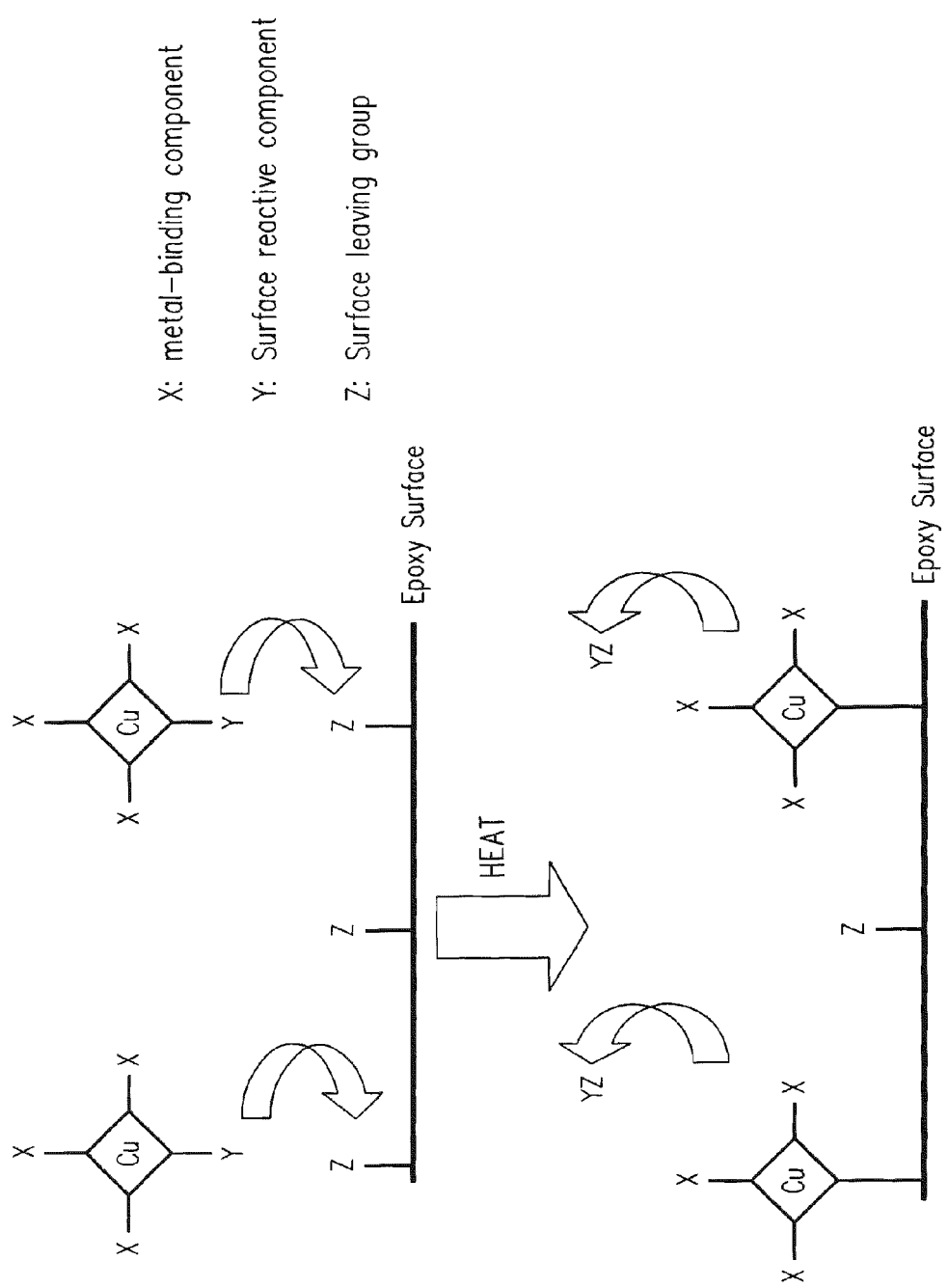
FIG. 3 shows a simplified exemplary reaction scheme for attaching organic molecules or films to the surface of a substrate, such as but not limited to an epoxy PCB substrate, according to one embodiment of the present invention.
Figure 4:
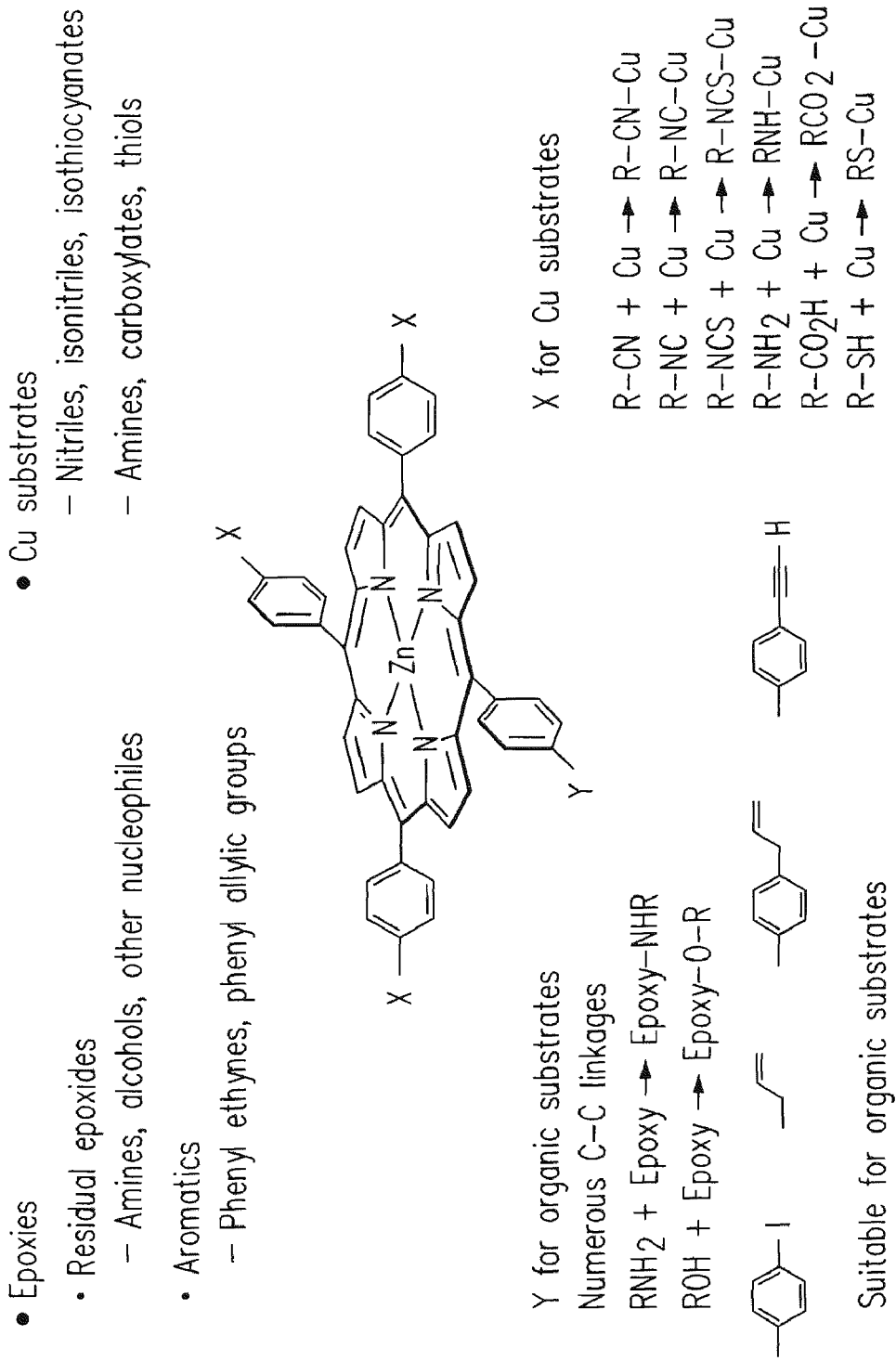
FIG. 4 illustrates exemplary embodiments of organic molecules suitable as a seed layer with various X and Y groups for attachment to copper and carbon substrates, respectively, according to embodiments of the present invention.

For example in some embodiments, as illustrated in FIG. 3 and FIG. 4, the molecules will comprise binding group(s) X which promote favorable organic—Cu bonds. Examples of suitable binding groups X include but are not limited to thiols, nitriles, thiocyanates, amines, alcohols and ethers. The molecules further comprise attachment group(s) Y which promote favorable molecule—organic substrate bonds. Examples of suitable Y groups include but are not limited to amines, alcohols, ethers, other nucleophile, phenyl ethynes, phenyl allylic groups and the like. According to embodiments of the present invention, and without limitation, some suitable molecules are shown in FIG. 4.

In another embodiment, molecules are attached to a metal or metal nitride present on a surface or substrate (e.g., Ta or TaN) to provide a seed layer for copper electroplating. In this embodiment molecules are provided that have attachment groups Y with a strong bond to TaN or Ta, and binding groups X that exhibit a strong Cu bond to reduce electromigration, and that the molecular layer is thin and/or conductive, as high current densities will be conducted from TaN to Cu, through the organic layer. The molecules would also attach to $TaO_2$, since TaN is likely to have some oxide once exposed to atmosphere.

Figure 5:
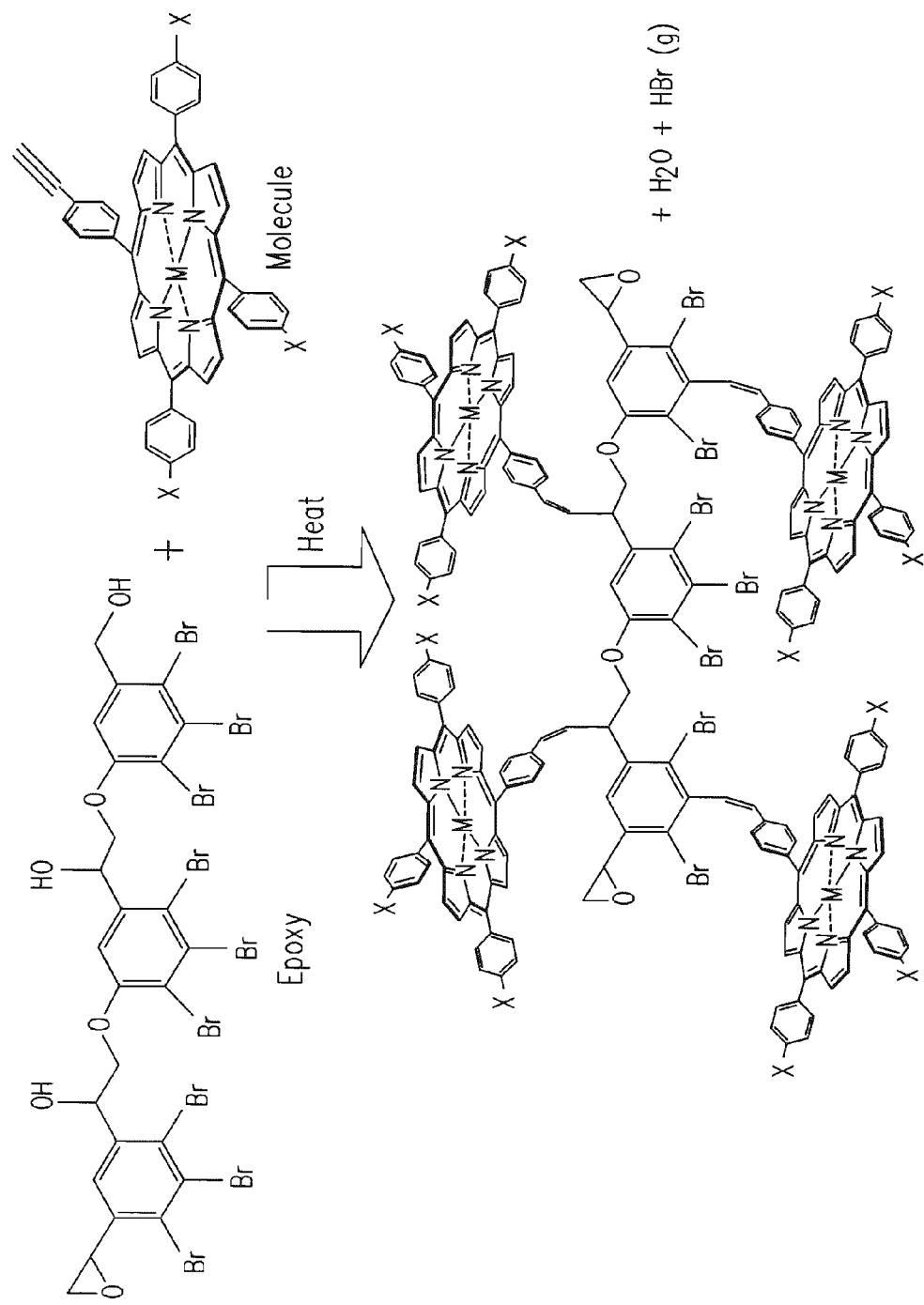
FIG. 5 illustrates an exemplary reaction method for attaching organic molecules to standard, or unmodified, epoxy substrates according to some methods of the present invention.
Figure 6:
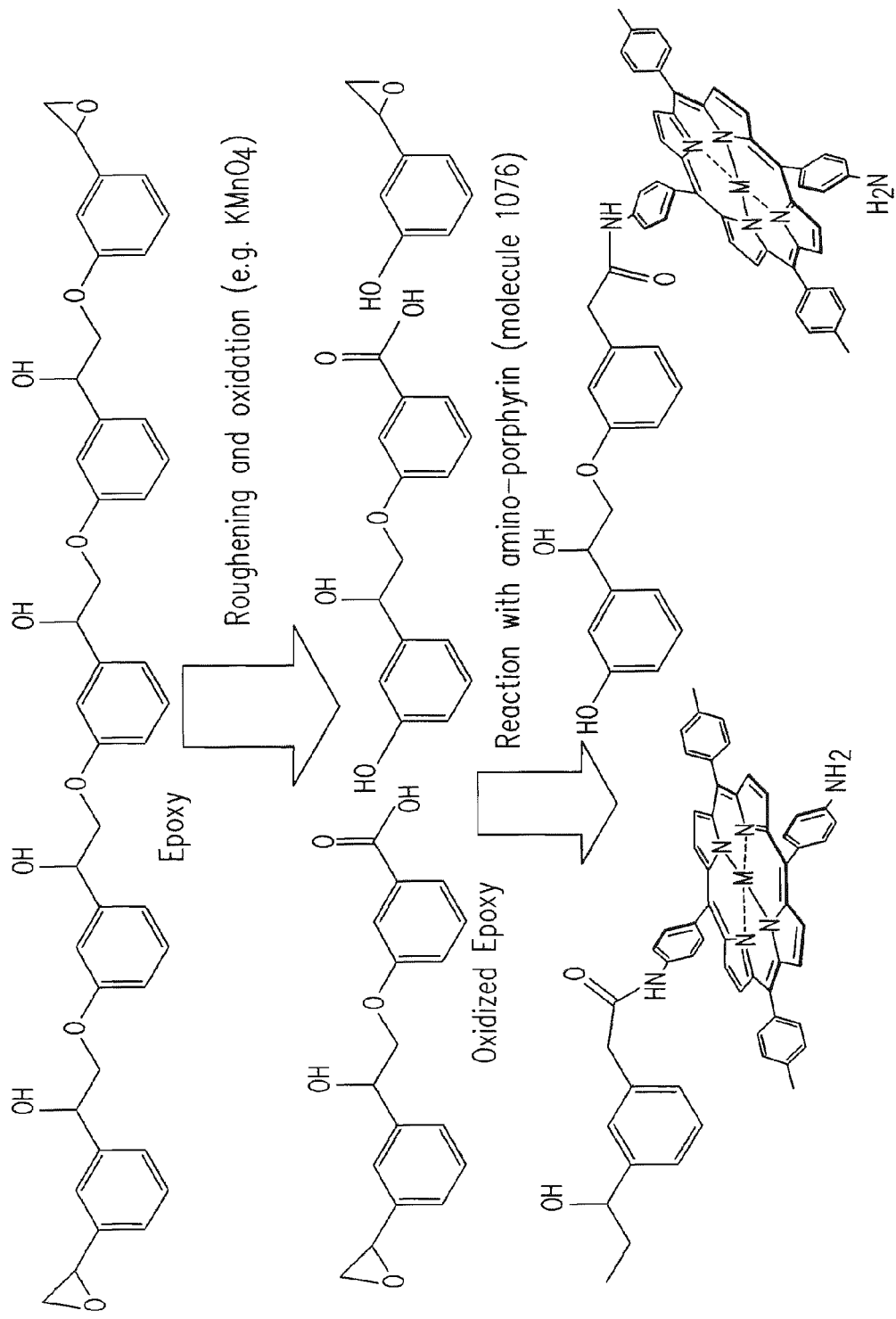
FIG. 6 depicts an exemplary reaction method for attaching organic molecules to desmeared epoxy substrates (e.g., typically having a partially roughened or oxidized surface), according to some methods of the present invention.
Figure 7:
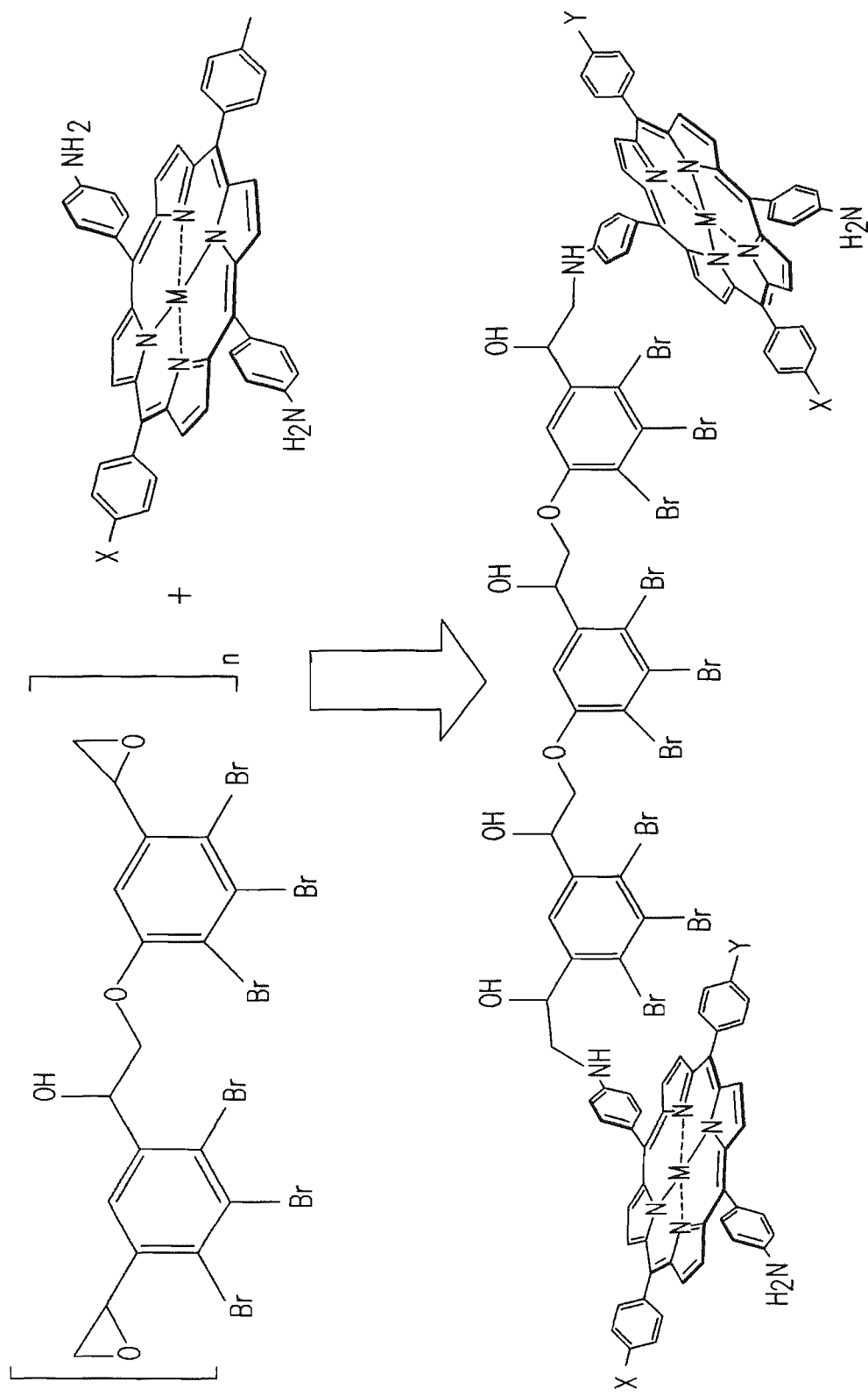
FIG. 7 shows an exemplary reaction method for attaching organic molecules to partially cured epoxy substrates (e.g., residual epoxides) according to some methods of the present invention.

Significantly, the present invention provides for selection of particular binding groups X and attachment groups Y depending upon the application. This allows one to practice the invention with a wide range of substrate materials, thus providing a flexible, robust process and a significant advance over conventional techniques. For example, FIG. 5 illustrates an exemplary reaction method for attaching organic molecules to standard epoxy substrates. Further, the methods of the present invention may be practiced with substrates which have undergone surface treatment. For example, FIG. 6 depicts an exemplary reaction method for attaching organic molecules to epoxy substrates having a partially roughened or oxidized surface. FIG. 7 shows an exemplary reaction method for attaching organic molecules to partially cured epoxy substrates (residual epoxides).

Electroplating solutions of the invention generally comprise at least one soluble, copper salt, an electrolyte and a brightener component. More particularly, electroplating compositions of the invention preferably contain a copper salt; an electrolyte, preferably an acidic aqueous solution such as a sulfuric acid solution with a chloride or other halide ion source; and one or more brightener agents as discussed above. Electroplating compositions of the invention also preferably contain a suppressor agent. The plating compositions also may contain other components such as one or more leveler agents and the like.

A variety of copper salts may be employed in the subject electroplating solutions, including for example copper sulfates, copper acetates, copper fluoroborate, and cupric nitrates. Copper sulfate pentahydrate is a particularly preferred copper salt. A copper salt may be suitably present in a relatively wide concentration range in the electroplating compositions of the invention. Preferably, a copper salt will be employed at a concentration of from about 10 to about 300 grams per liter of plating solution, more preferably at a concentration of from about 25 to about 200 grams per liter of plating solution, still more preferably at a concentration of from about 40 to about 175 grams per liter of plating solution.

Plating baths of the invention preferably employ an acidic electrolyte, which typically will be an acidic aqueous solution and that preferably contains a halide ion source, particularly a chloride ion source. Examples of suitable acids for the electrolyte include sulfuric acid, acetic acid, fluoroboric acid, methane sulfonic acid and sulfamic acid. Sulfuric acid is generally preferred. Chloride is a generally preferred halide ion. A wide range of halide ion concentrations (if a halide ion is employed) may be suitably utilized, e.g. from about 0 (where no halide ion employed) to 100 parts per million (ppm) of halide ion in the plating solution, more preferably from about 25 to about 75 ppm of halide ion source in the plating solution.

Embodiments of the invention also include electroplating baths that are substantially or completely free of an added acid and may be neutral or essentially neutral (e.g. pH of at least less than about 8 or 8.5). Such plating compositions are suitably prepared in the same manner with the same components as other compositions disclosed herein but without an added acid. Thus, for instance, a preferred substantially neutral plating composition of the invention may have the same components as the plating bath of Example 3 which follows, but without the addition of sulfuric acid. A wide variety of brighteners, including known brightener agents, may be employed in the copper electroplating compositions of the invention. Typical brighteners contain one or more sulfur atoms, and typically without any nitrogen atoms and a molecular weight of about 1000 or less. In addition to the copper salts, electrolyte and brightener, plating baths of the invention optionally may contain a variety of other components, including organic additives such as suppressors agents, leveling agents and the like. Use of a suppressor agent in combination with an enhanced brightener concentration is particularly preferred and provides surprisingly enhanced plating performance, particularly in bottom-fill plating of small diameter and/or high aspect ratio microvias.

Use of one or more leveling agents in plating baths of the invention is generally preferred. Examples of suitable leveling agents are described and set forth in U.S. Pat. Nos. 3,770,598, 4,374,709, 4,376,685, 4,555,315 and 4,673,459. In general, useful leveling agents include those that contain a substituted amino group such as compounds having R—N—R', where each R and R' is independently a substituted or unsubstituted alkyl, group or a substituted or unsubstituted aryl group. Typically the alkyl groups have from 1 to 6 carbon atoms, more typically from 1 to 4 carbon atoms. Suitable aryl groups include substituted or unsubstituted phenyl or naphthyl. The substituents of the substituted alkyl and aryl groups may be, for example, alkyl, halo and alkoxy.

Other characteristics and advantages of the present invention will also become apparent to a person skilled in the art on reading the examples below, given as non-limiting illustrations, with reference to the attached figures.

Of particular advantage, various parameters can be optimized for attachment of any particular organic molecule. These include (1) the concentration of the molecule(s), (2) the baking time, and (3) the baking temperature. These procedures typically use various concentrations of molecules in solution or neat molecules. The use of very small amounts of material indicates that relatively small amounts of organic solvents can be used, thereby minimizing environmental hazards.

In addition, baking times as short as a few minutes (e.g., typically from about 1 sec to about 1 hr, preferably from about 10 sec to about 30 min, more preferably from about 1 minute to about 15, 30, or 45 minutes, and most preferably from about 5 min to about 30 minutes) afford high surface coverage. Short times minimize the amount of energy that is used in the processing step.

Baking temperatures as high as 400° C. and greater can be used with no degradation of certain types of molecules. This result is of importance in that many processing steps in fabricating PCB or semiconductor devices entail high temperature processing. In certain embodiments, preferred baking temperatures range from about 25° C. to about 400° C., preferably from about 100° C. to about 200° C., more preferably from about 150° C. to about 250° C., and most preferably from about 150° C. to about 200° C.

Diverse functional groups on the organic molecules are suitable for use in attachment to silicon or other substrates (e.g. Group III, IV, or V elements, transition metals, transition metal oxides or nitrides, transition metal alloys, etc.). The groups include, but are not limited to, amine, alcohol, ether, thiol, S-acetylthiol, bromomethyl, allyl, iodoaryl, carboxaldehyde, ethyne, vinyl, hydroxymethyl. It is also noted that groups such as ethyl, methyl, or arene afford essentially no attachment.

While in certain embodiments, heating is accomplished by placing the substrate in an oven, essentially any convenient heating method can be utilized, and appropriate heating and contacting methods can be optimized for particular (e.g., industrial) production contexts. Thus, for example, in certain embodiments, heating can be accomplished by dipping the surface in a hot solution containing the organic molecules that are to be attached. Local heating/patterning can be accomplished using for example a hot contact printer, or a laser. Heating can also be accomplished using forced air, a convection oven, radiant heating, and the like. The foregoing embodiments are intended to be illustrative rather than limiting.

In some embodiments the organic molecule is provided in a solvent, dispersion, emulsion, paste, gel, or the like. Preferred solvents, pastes, gels, emulsions, dispersions, etc., are solvents that can be applied to the Group II, III, IV, V, and/or VI material(s), and/or transition metals without substantially degrading that substrate and that solubilize or suspend, but do not degrade the organic molecule(s) that are to be coupled to the substrate. In certain embodiments, preferred solvents include high boiling point solvents (e.g., solvents with an initial boiling point greater than about 130° C., preferably greater than about 150° C., more preferably greater than about 180° C.). Such solvents include, but are not limited to propylene glycol monomethyl ether acetate (PGMEA), benzonitrile, dimethylformamide, xylene, ortho-dichlorobenzene, and the like.

In some embodiments, to effect attachment to the substrate (e.g., a Group II, III, IV, V, or VI element, semiconductor, and/or oxide, and/or transition metal, transition metal oxide or nitride, epoxy or other polymer-based material, etc.) the heat-resistant organic molecule either bears one or more attachment group(s) Y (e.g., as substituent(s)) and/or is derivatized so that it is attached directly or through a linker to the substrate.

In certain preferred embodiments, the attachment group Y comprises an aryl or an alkyl group. Certain preferred aryl groups include a functional group such as amino, alkylamino, bromo, iodo, hydroxy, ether, hydroxymethyl, formyl, bromomethyl, vinyl, allyl, S-acetylthiomethyl, Se-acetylselenomethyl, ethynyl, 2-(trimethylsilyl)ethynyl, mercapto, mercaptomethyl, 4,4,5,5-tetramethyl-1,3,2-dioxaborolan-2-yl, and dihydroxyphosphoryl. Certain preferred alkyls include a functional group such as bromo, iodo, hydroxy, formyl, vinyl, mercapto, selenyl, S-acetylthio, Se-acetylseleno, ethynyl, 2-(trimethylsilyl)ethynyl, 4,4,5,5-tetramethyl-1,3,2-dioxaborolan-2-yl, and dihydroxyphosphoryl.

In certain embodiments the attachment groups Y include, but are not limited to alcohols, thiols, S-acetylthiols, bromomethyls, allyls, iodoaryls, carboxaldehydes, ethynes, and the like. In certain embodiments, the attachment groups include, but are not limited to 4-(hydroxymethyl)phenyl, 4-(S-acetylthiomethyl)phenyl, 4-(Se-acetylselenomethyl) phenyl, 4-(mercaptomethyl)phenyl, 4-(hydroselenomethyl) phenyl, 4-formylphenyl, 4-(bromomethyl)phenyl, 4-vinylphenyl, 4-ethynylphenyl, 4-allylphenyl, 4-[2-(trimethylsilyl)ethynyl]phenyl, 4-[2-(triisopropylsily) ethynyl]phenyl, 4-bromophenyl, 4-iodophenyl, 4-hydroxyphenyl, 4-(4,4,5,5-tetramethyl-1,3,2-dioxaborolan-2-yl)phenyl bromo, iodo, hydroxymethyl, S-acetylthiomethyl, Se-acetylselenomethyl, mercaptomethyl, hydroselenomethyl, formyl, bromomethyl, chloromethyl, ethynyl, vinyl, allyl, 4-[2-(4-(hydroxymethyl)-phenyl)ethynyl]phenyl, 4-(ethynyl)biphen-4'-yl, 4-[2-(triisopropylsilyl)ethynyl] biphen-4'-yl, 3,5-diethynylphenyl, 2-bromoethyl, and the like. These attachment groups Y are meant to be illustrative and not limiting.

The suitability of other attachment groups Y can readily be evaluated. A heat-resistant organic molecule bearing the attachment group(s) of interest (directly or on a linker) is coupled to a substrate (e.g., epoxy) according to the methods described herein. The efficacy of attachment can then be evaluated spectroscopically, e.g., using reflectance UV absorption measurements.

The attachment groups Y can be substituent(s) comprising the heat-resistant organic molecule. Alternatively, the organic molecule can be derivatized to link the attachment group(s) Y thereto either directly or through a linker.

Means of derivatizing molecules, e.g., with alcohols or thiols are well known to those of skill in the art (see, e.g., Gryko et al. (1999) J. Org. Chem., 64: 8635-8647; Smith and March (2001) March's Advanced Organic Chemistry, John Wiley & Sons, 5th Edition, etc.).

Where the attachment group Y comprises an amine, in certain embodiments, suitable amines include, but are not limited to a primary amine, a secondary amine, a tertiary amine, a benzyl amine, and an aryl amine. Certain particularly preferred amines include, but are not limited to 1 to 10 carbon straight chain amine, aniline, and phenethyl amine.

Where the attachment group Y comprises an alcohol, in certain embodiments, suitable alcohols include, but are not limited to a primary alcohol, a secondary alcohol, a tertiary alcohol, a benzyl alcohol, and an aryl alcohol (i.e., a phenol). Certain particularly preferred alcohols include, but are not limited to 2 to 10 carbon straight chain alcohols, benzyl alcohol, and phenethyl alcohol or ether containing side group.

When the attachment group Y comprises a thiol, in certain embodiments, suitable thiols include, but are not limited to a primary thiol, a secondary thiol, a tertiary thiol, a benzyl thiol, and an aryl thiol. Particularly preferred thiols include, but are not limited to 2 to 10 carbon straight chain thiols, benzyl thiol, and phenethyl thiol.

The surface can take essentially any form. For example, it can be provided as a planar substrate, an etched substrate, a deposited domain on another substrate and the like. Particularly preferred forms include those forms of common use in solid state electronics and circuit board fabrication processes. However, the present invention is not limited to conventional substrate shapes. For example, the surface or substrate may be curves and other non-planar shapes. Additionally, the substrate may be a photovoltaic or solar cell device.

Although not necessarily required, in certain embodiments the surface is cleaned before and/or after molecule attachment, e.g., using standard methods known to those of skill in the art. Thus, for example, in one preferred embodiment, the surface can be cleaned by sonication in a series of solvents (e.g., acetone, toluene, acetone, ethanol, and water) and then exposed to a standard wafer-cleaning solution (e.g., Piranha (sulfuric acid: 30% hydrogen peroxide, 2:1)) at an elevated temperature (e.g., 100° C.). Various alkaline permanganate treatments have been used as standard methods for desmearing surfaces of printed circuit boards, including the throughholes. Such permanganate treatments have been employed for reliably removing wear and drilling debris, as well as for texturing or micro roughening the exposed epoxy resin surfaces. The latter effect significantly improves through-hole metallization by facilitating adhesion to epoxy resin, at the price of roughening the copper and decreasing the frequency response of the copper traces. Other conventional smear removal methods have included treatment with sulfuric acid, chromic acid, and plasma desmear, which is a dry chemical method in which boards are exposed to oxygen and fluorocarbon gases, e.g., CF4. Generally, permanganate treatments involve three different solution treatments used sequentially. They are (1) a solvent swell solution, (2) a permanganate desmear solution, and (3) a neutralization solution. FIG. 6 depicts the reaction of molecules with an epoxy substrate that has been desmeared, and has oxidized functional groups available for reaction on the surface.

In certain embodiments, oxides can be removed from the substrate surface and the surface can be hydrogen passivated. A number of approaches to hydrogen passivation are well known to those of skill in the art. For example, in one approach, a flow of molecular hydrogen is passed through dense microwave plasma across a magnetic field. The magnetic field serves to protect the sample surface from being bombarded by charged particles. Hence the crossed beam (CB) method makes it possible to avoid plasma etching and heavy ion bombardment that are so detrimental for many semiconductor devices (see, e.g., Balmashnov, et al. (1990) Semiconductor Science and Technology, 5: 242). In one particularly preferred embodiment, passivation is by contacting the surface to be passivated with an ammonium fluoride solution (preferably purged of oxygen).

Other methods of cleaning and passivating surfaces are known to those of skill in the art (see, e.g., Choudhury (1997) The Handbook of Microlithography, Micromachining, and Microfabrication; Bard & Faulkner (1997) Fundamentals of Electrochemistry, Wiley, New York, and the like).

In certain embodiments, the heat-resistant organic molecules are attached to form a uniform or substantially uniform film across the surface of the substrate. In other embodiments, the organic molecules are separately coupled at one or more discrete locations on the surface. In certain embodiments, different molecules are coupled at different locations on the surface.

The location at which the molecules are coupled can be accomplished by any of a number of means. For example, in certain embodiments, the solution(s) comprising the organic molecule(s) can be selectively deposited at particular locations on the surface. In certain other embodiments, the solution can be uniformly deposited on the surface and selective domains can be heated. In certain embodiments, the organic molecules can be coupled to the entire surface and then selectively etched away from certain areas. Alternatively, the linker moiety can be designed to react selectively with specific functional groups on the substrate, allowing the molecule attachment process to act as the patterning step as well.

The most common approach to selectively contacting the surface with the organic molecule(s) involves masking the areas of the surface that are to be free of the organic molecules so that the solution or gas phase comprising the molecule(s) cannot come in contact with the surface in those areas. This is readily accomplished by coating the substrate with a masking material (e.g., a polymer resist) and selectively etching the resist off of areas that are to be coupled. Alternatively a photoactivatible resist can be applied to the surface and selectively activated (e.g., via UV light) in areas that are to be protected. Such "photolithographic" methods are well known in the semiconductor industry (see e.g., Van Zant (2000) Microchip Fabrication: A Practical Guide to Semiconductor Processing; Nishi and Doering (2000) Handbook of Semiconductor Manufacturing Technology; Xiao (2000) Introduction to Semiconductor Manufacturing Technology; Campbell (1996) The Science and Engineering of Microelectronic Fabrication (Oxford Series in Electrical Engineering), Oxford University Press, and the like). In addition, the resist can be patterned on the surface simply by contact printing the resist onto the surface.

In other approaches, the surface is uniformly contacted with the molecules. The molecules can then be selectively etched off the surface in areas that are to be molecule free. Etching methods are well known to those of skill in the art and include, but are not limited to plasma etching, laser etching, acid etching, and the like.

Other approaches involve contact printing of the reagents, e.g., using a contact print head shaped to selectively deposit the reagent(s) in regions that are to be coupled, use of an inkjet apparatus (see e.g., U.S. Pat. No. 6,221,653) to selectively deposit reagents in particular areas, use of dams to selectively confine reagents to particular regions, and the like.

In certain preferred embodiments, the coupling reaction is repeated several times. After the reaction(s) are complete, uncoupled organic molecules are washed off of the surface, e.g., using standard wash steps (e.g., benzonitrile wash followed by sonication in dry methylene chloride). Additional surface cleaning steps (e.g., additional washes, descuming or desmearing steps, and the like) may be used subsequent to molecule attachment to remove excess unreacted molecules prior to metal deposition, especially on via containing structures.

In one instance, a molecule consisting of a porphyrin macrocycle with a central Cu metal was bonded to a TaN surface as described above. Molecules are selected for use based on their affinity to form a bond with the substrate, their thermal stability and their affinity for $Cu^{2+}$ ions. The high affinity of the attached molecule facilitated electroless plating of the copper, which can then be used as a seed layer to electroplate larger quantities of copper.

Figure 8A:
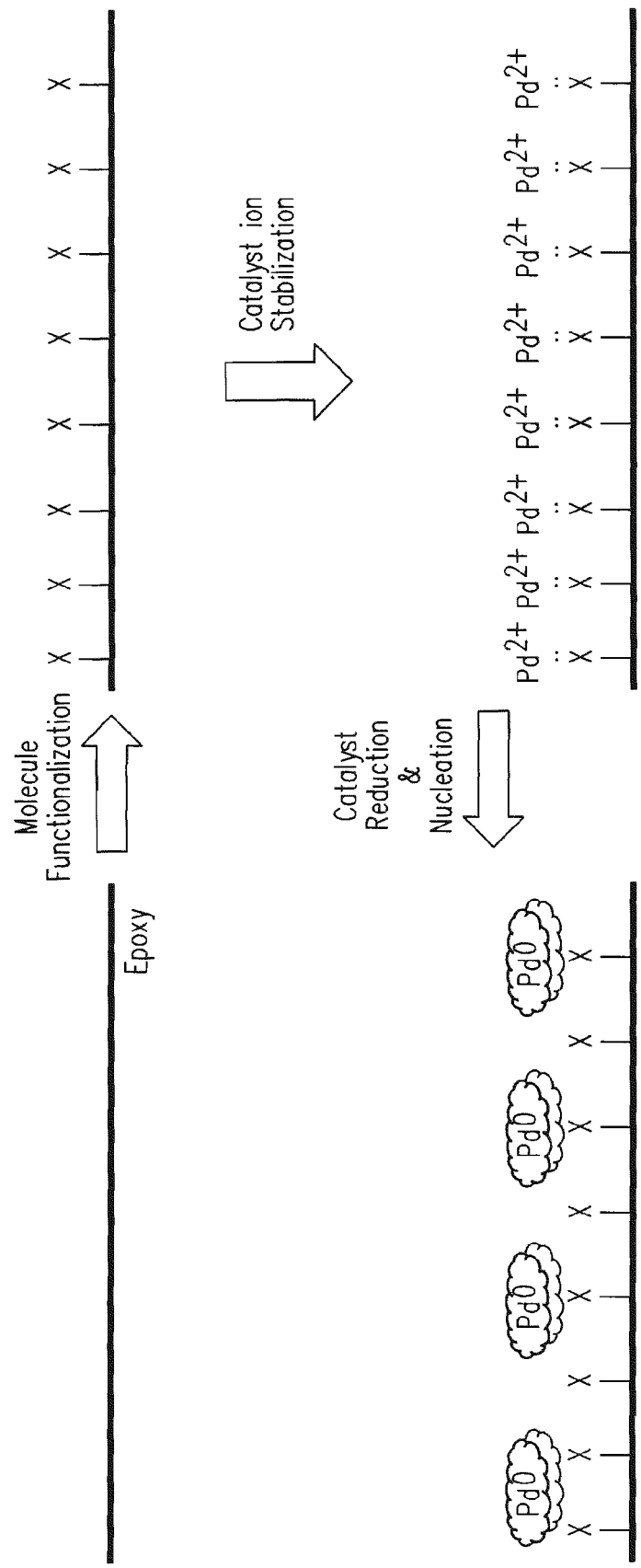
FIGS. 8A and 8B illustrate possible reaction mechanisms by which copper is formed on the organic molecule seed layer according to some methods of the present invention.
Figure 8B:
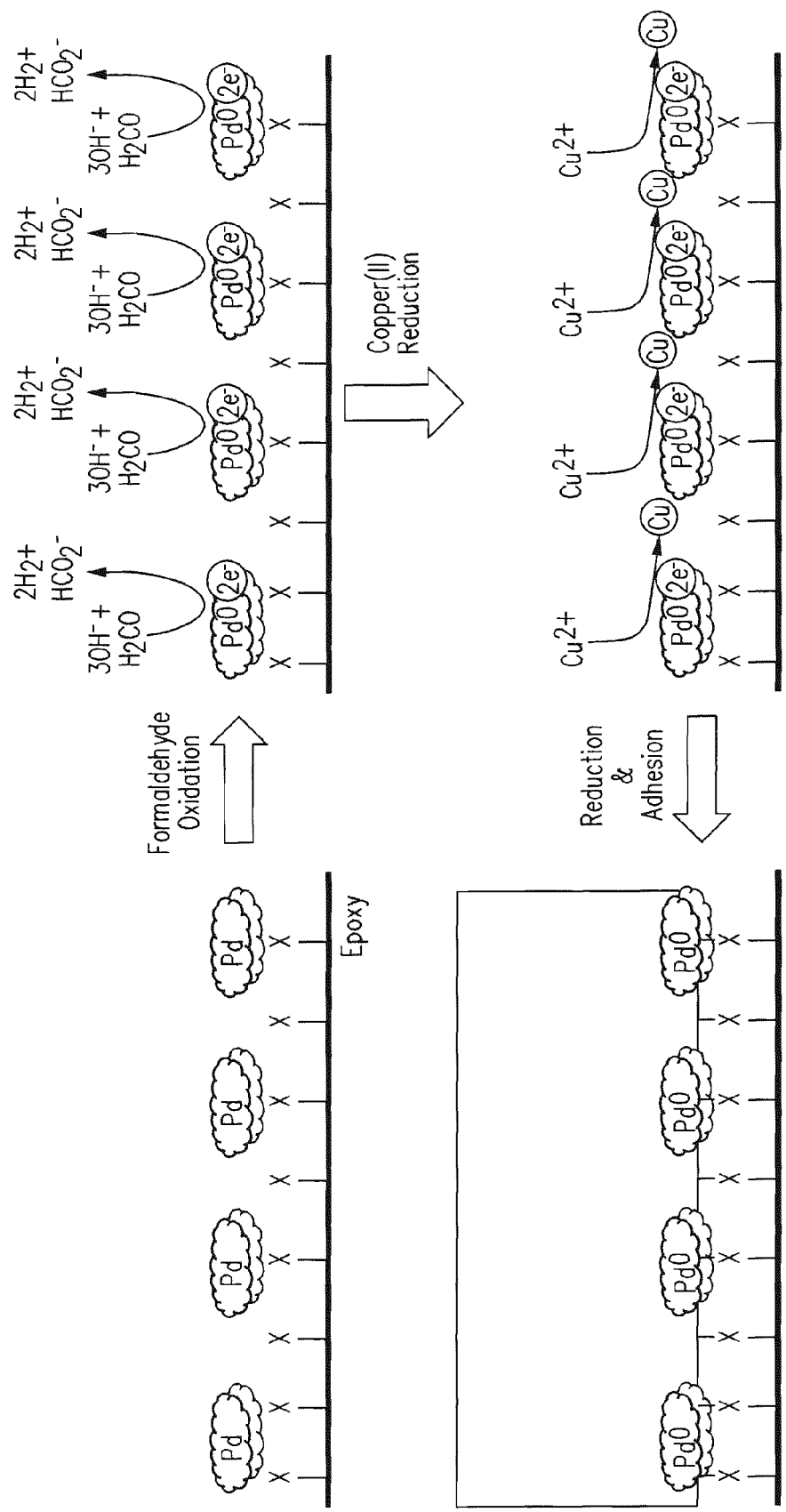

Electroplating on the molecule-covered substrate is accomplished as described above. Briefly, molecule coated substrates are immersed in a plating bath containing appropriate levels of a copper salt, an electrolyte preferably an acidic aqueous solution such as a sulfuric acid solution with a chloride or other halide ion source, and one or more brightener agents in enhanced concentrations as discussed above, and preferably a suppressor agent. The plating compositions also may contain other components such as one or more leveler agents and the like. A cathodic voltage (e.g, −1 V) is applied to the molecule-covered substrate, causing the reduction of the $Cu^{2+}$ ions to $Cu^0(s)$, which deposit on the molecular layer to form a metallic layer on top of the molecular layer. Without being bound by any particular theory, FIG. 8A and FIG. 8B illustrate one possible reaction mechanism showing $Cu^{2+}$ ion deposition and subsequent reduction to copper layer $Cu^0(s)$, respectively. This copper layer has the same properties as a copper layer that is deposited in conventional protocols, and can be processed subsequently in similar ways, including lithographic patterning, damascene and dual-damascene processes.

EXPERIMENTAL

The present invention may be better understood from the examples that follow. A number of experiments were conducted as described below. The examples are shown for illustration purposes only, and are not intended to limit the invention in any way.

EXAMPLES

Figure 9:
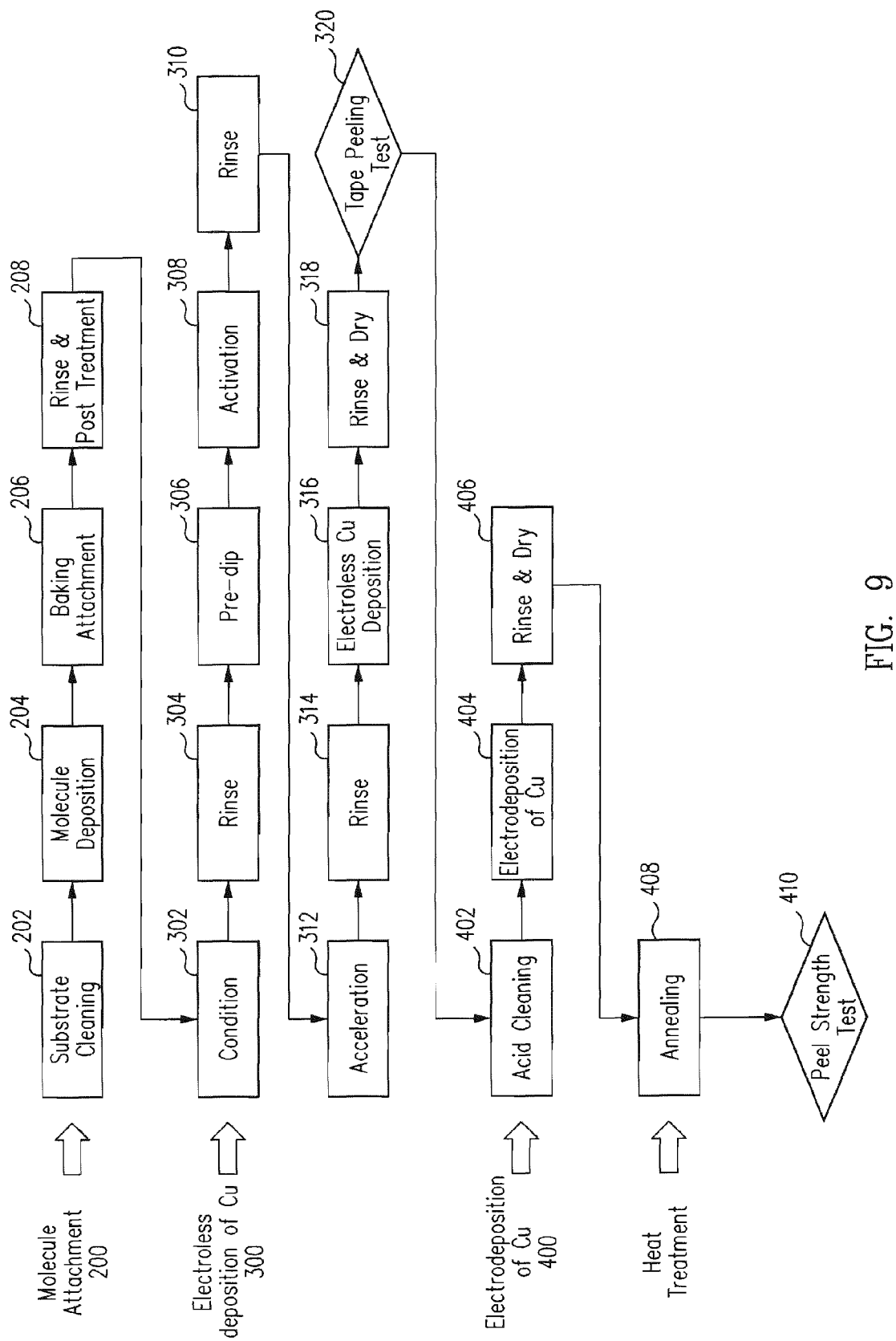
FIG. 9 illustrates experimental process flow diagrams comprising molecule attachment, electroless Cu deposition, electrolytic Cu deposition, and heat treatment.

In order to further illustrate the features of the present invention, an exemplary experimental process flow schematically illustrated in FIG. 9. comprises four major steps: (1) molecule attachment 200 (2) electroless Cu deposition 300, (3) electrolytic Cu deposition 400, and (4) optional heat treatment. The specific data and results are shown for illustrative purposes only and are not intended to limit the scope of the invention in any way. FIG. 9 shows where in the process the tape peeling and peel strength tests are carried out, however this is shown only to illustrate the testing procedures. The broad method steps of the present invention do not include the peeling test steps. Referring to FIG. 9, in the exemplary experimental procedure, molecular attachment is carried out by cleaning of the substrate 202, depositing or contacting the one or more molecules with the substrate 204, heating or baking the substrate to promote attachment of the molecules to the substrate at step 206 and then rinsing the substrate and post treatment 208.

Next electroless deposition of copper is carried out at step 300. Specifically, the substrate may be conditioned 302, rinsed 304 and pre-dipped 306. Activation 308 of the substrate and rinsing 310 again are performed. Acceleration 312 and further rinse step 314 are performed followed by electroless copper deposition at step 316. The substrate with electroless copper is then rinsed and dried 318. At this stage, a tape peeling test 320 is conducted to determine the quality and adhesion of the copper layer. Actual test results are shown below.

Next electrodeposition of copper is carried out at step 400. Following the tape peeling test, the substrate is acid cleaned 402. Electrodeposition of copper on the substrate is then carried out at step 404. The substrate is then rinsed and dried 406. Optionally, post heat treatment may be carried out at step 408, followed by peel strength testing at step 410. Actual test results are shown below.

Example 1

Molecule Attachment

Figure 10:
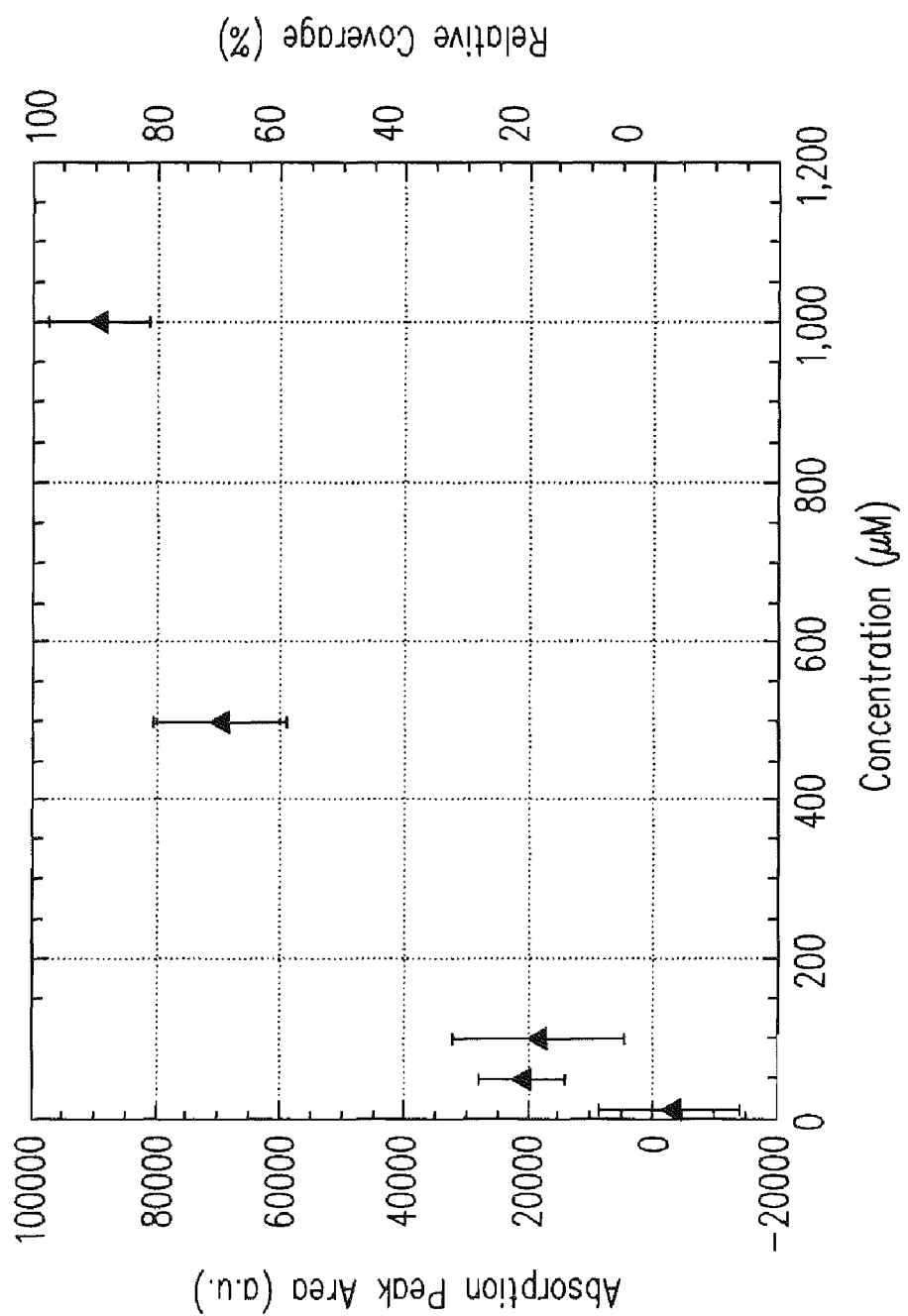
FIG. 10 and FIG. 11 depict molecule surface coverage on an epoxy surface quantified by UV absorption as a function of solution concentration and attachment temperature, respectively.
Figure 11:
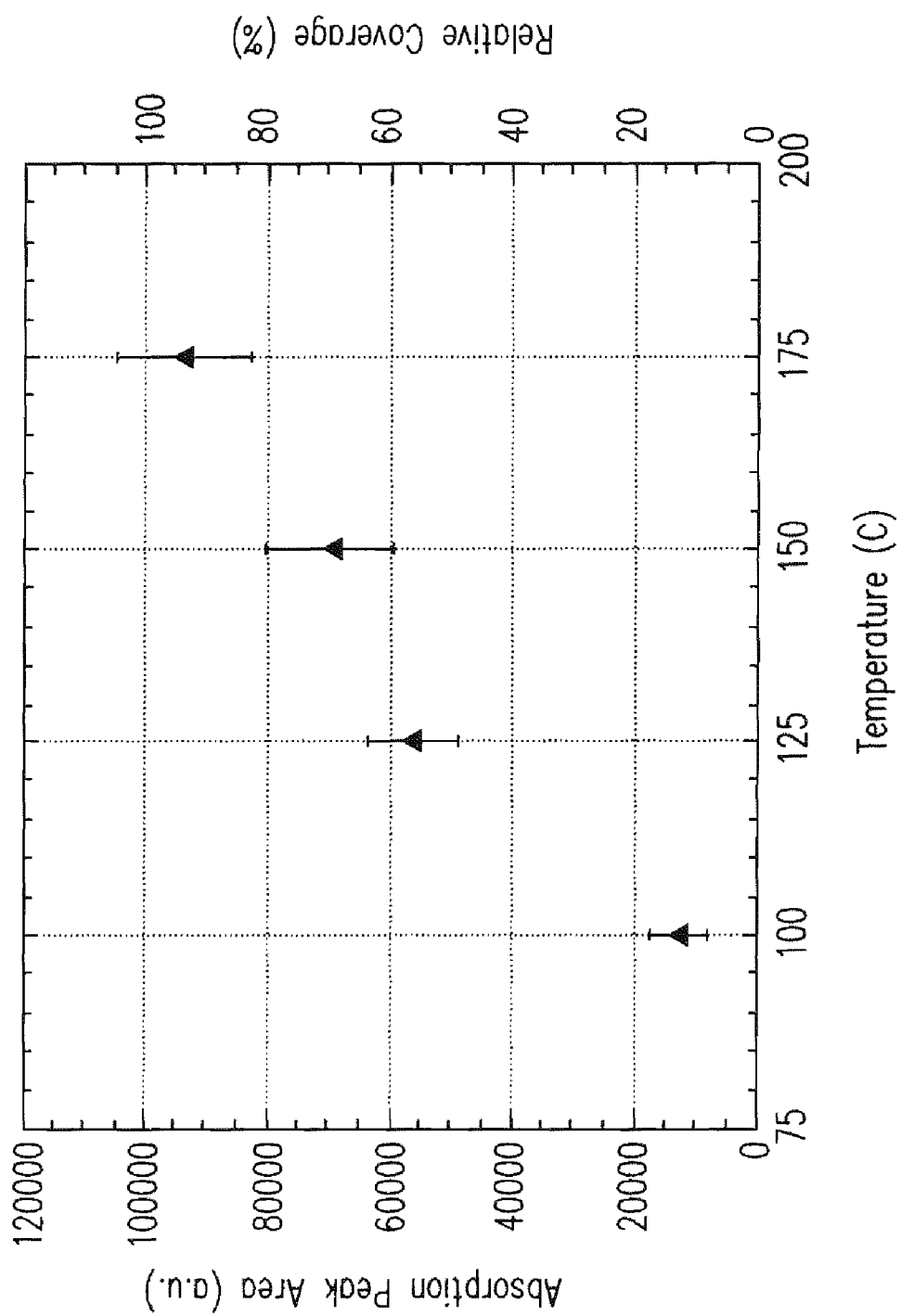

This example illustrates one exemplary approach to form a layer of organic molecules on a PCB substrate. In this instance, the ethynyl-terminated molecules, shown in FIG. 4, are attached to epoxy surface via the formation of C—C bond, as illustrated in FIG. 5. A commercial smooth epoxy resin substrate was first cleaned by sonication for 5 minutes in water and then isopropyl alcohol. The substrate was coated with a solution containing 0.1 to 1 mM of the porphyrin molecule in an appropriate solvent (e.g., hexane, toluene, and the like) by either dip-coating, drop-coating, or spin-coating. The sample was then baked at 100 to 200° C. for 20 minutes and followed by standard surface cleaning processes to remove the residual unattached molecules. The amount of molecule attached can be adjusted by varying the concentration of the molecule, the attachment temperature, and duration, and monitored by UV absorption spectroscopy as illustrated in FIGS. 10 and 11. As illustrated in FIG. 10, the UV adsorption strength is proportional to the molecule coverage which increases with increase in attachment concentration. Additionally, molecule coverage increases with increase in attachment temperature as shown in FIG. 11.

Example 2

Electroless Cu Deposition

Figure 12B:
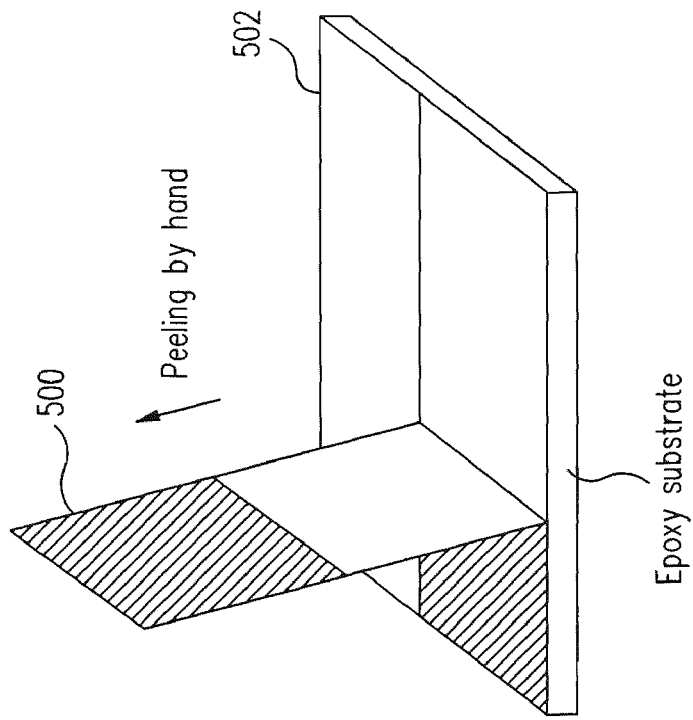
FIGS. 12A and 12B schematically illustrates the qualitative characterization of peel strength of electroless copper deposited on epoxy substrate according to methods of the present invention.
Figure 12A:
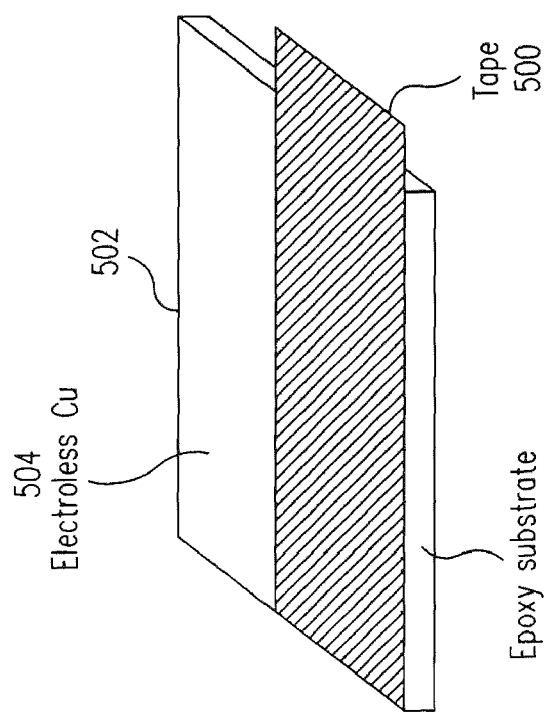
Figure 13:
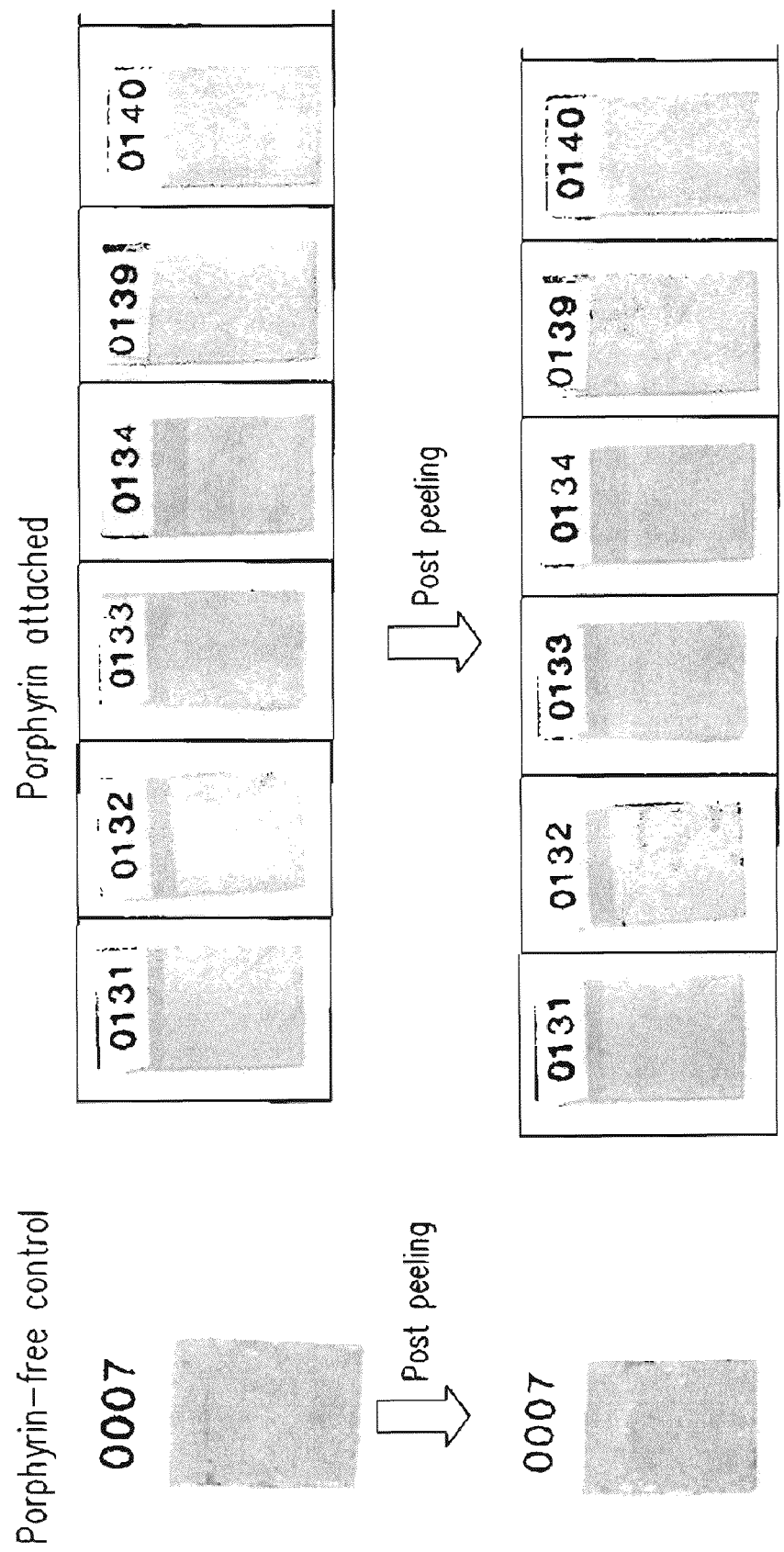
FIG. 13 and FIG. 14 are photographs of test coupons showing the impact of porphyrin molecules on the adhesion of electroless copper on epoxy surfaces formed according to methods of the present invention as represented by tape peeling tests, and compared to control test coupons.
Figure 14:
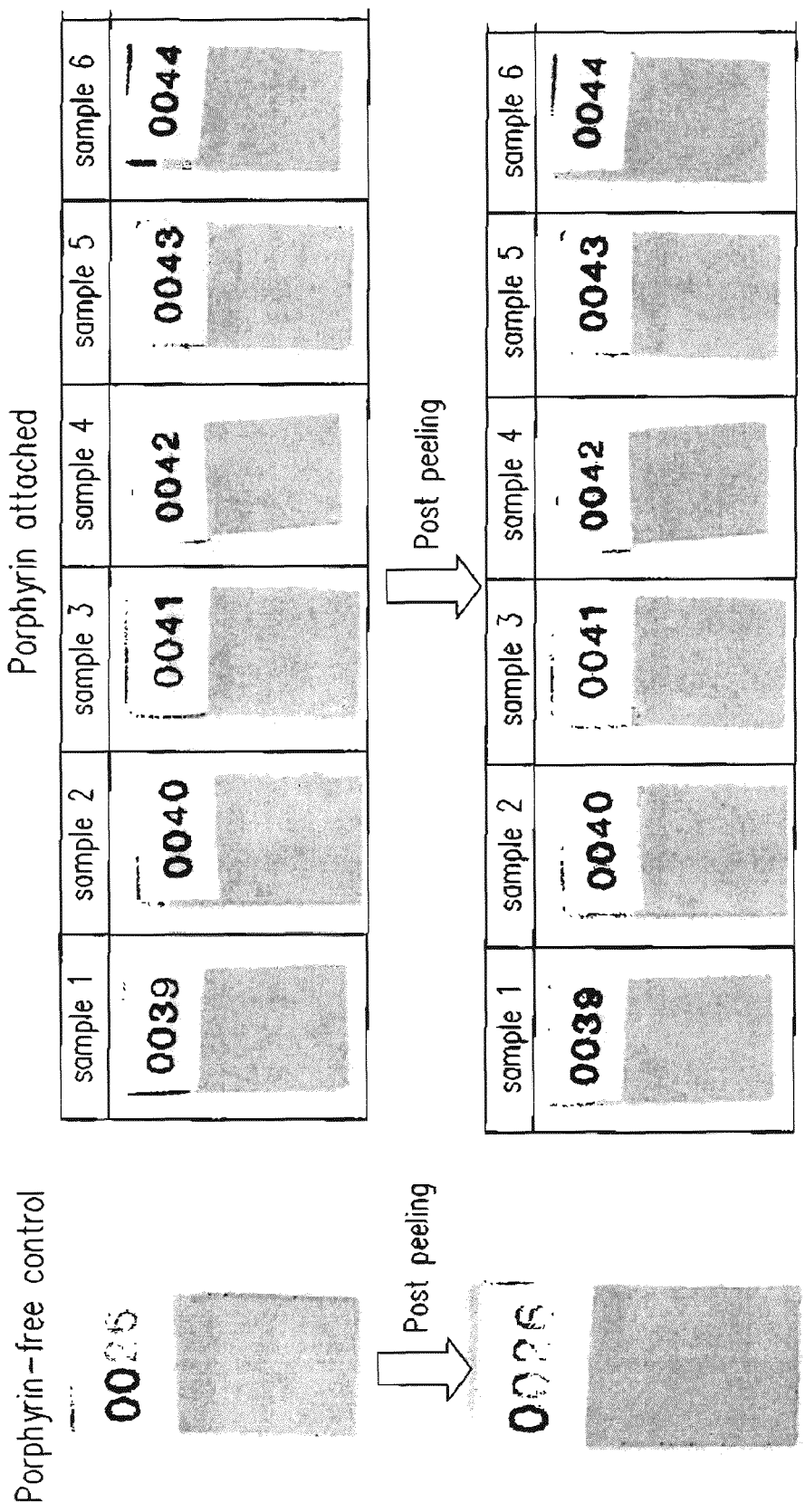
Figure 15B:
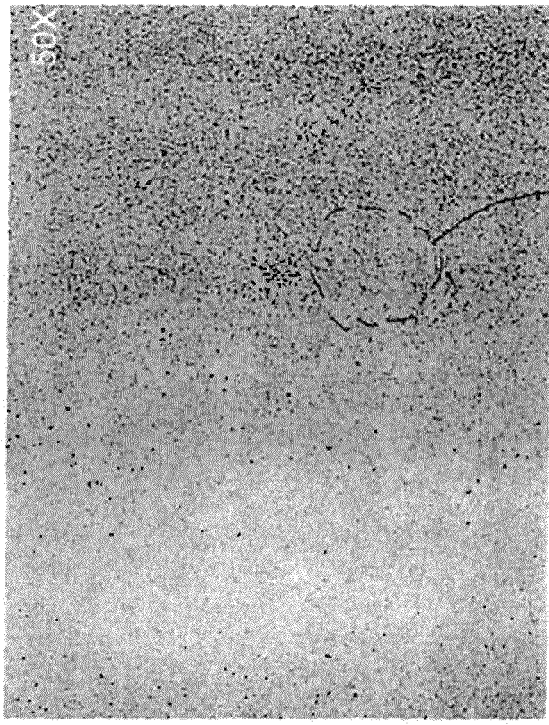
FIGS. 15A and 15B show magnified photographs of substrates demonstrating the impact of porphyrin molecules on the defect density of electroless copper according to methods of the present invention as observed with optical spectroscopy.
Figure 15B:
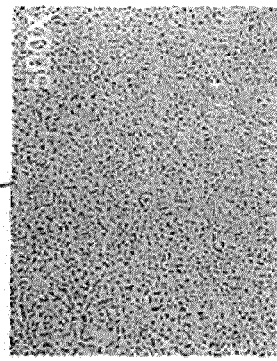
Figure 15A:
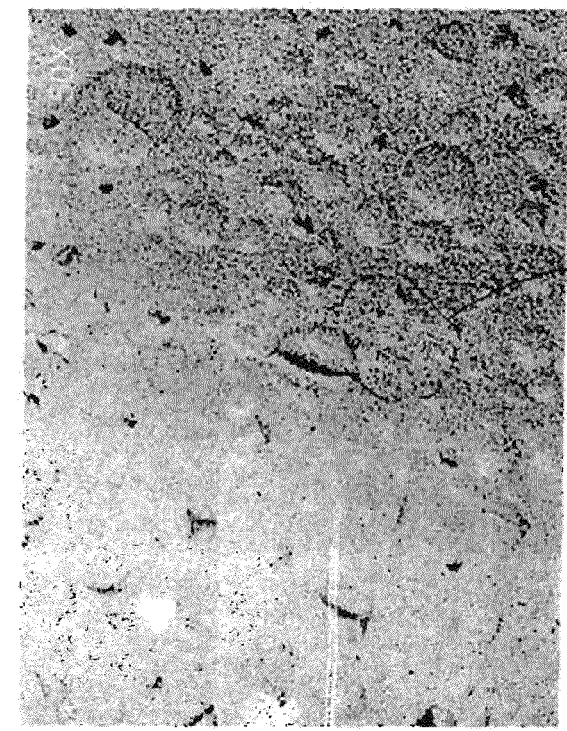
Figure 15A:
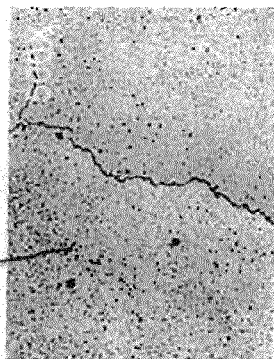

Following molecule attachment and surface cleaning processes, the epoxy substrate was subjected to electroless Cu deposition in the following manner: (a) immersed in Shipley/Circuposit Conditioner 3320 for 10 min at 65° C. followed by DI water rinse at 65° C. for 1 min, (b) immersed in Shipley/Cataposit Catalyst 404 (Pre-dip) at 23° C. for 1 min and then in Shipley/Cataposit Catalyst 44 (Activation) at 40° C. for 5 min followed by DI water rinse at 23° C. for 1 min, (c) immersed in Shipley/Accelerator 19E (Acceleration) at 30° C. for 5 min followed by DI water rinse at 23° C. for 1 min, (d) immersed in Shipley/Cuposit 328L Copper Mix (E-less Cu) at 30° C. for 10 min followed by DI water rinse at 23° C. for 1 min and blow dry with air at 23° C. for 1 min. The electroless film was evaluate by tape peeling shown in FIGS. 12-14 and characterized by microscopy shown in FIG. 15. FIGS. 12A and 12B schematically illustrate the tape peeling test techniques. Tape 500 is placed and pressed on a portion of a test coupon, in this instance epoxy substrate 502 having electroless copper 504, formed thereon by methods of the present invention. A portion of the tape 500 is then peeled off by hand. The tape peeling test gives a qualitative characterization of the peel strength of the copper layer and is generally performed to test the electroless copper layer. FIG. 13 shows photographs of multiple test coupons 0131 to 0140 of epoxy A substrates having electroless cooper formed thereon by methods of the present invention along with control test coupon 0007 which was not prepared according to the invention. FIG. 14 shows photographs of multiple test coupons 0039 to 0040 of epoxy B substrates having electroless copper formed thereon by methods of the present invention along with control test coupon 0026 which was not prepared according to the invention. Test coupons are shown before and after peeling in both figures. As shown in FIGS. 13 and 14 the porphyrin molecules of the present invention provide a good substrate for plating and enhance copper adhesion to the smooth epoxy surface. Additionally, better copper coverage is generally achieved with the substrates prepared according to the present invention. FIGS. 15A and 15B further illustrate that the porphyrin molecules also reduce the defect density therefore promoting the adhesion between copper and epoxy substrate. As shown in FIG. 15B, both at 50× and 500× magnifications, the copper layer on epoxy B substrates prepared according to the present invention exhibits good copper adhesion and low defect density, and is significantly superior to the copper layer prepared conventionally (FIG. 15A).

Example 3

Electrolytic Cu Deposition

Figure 16B:
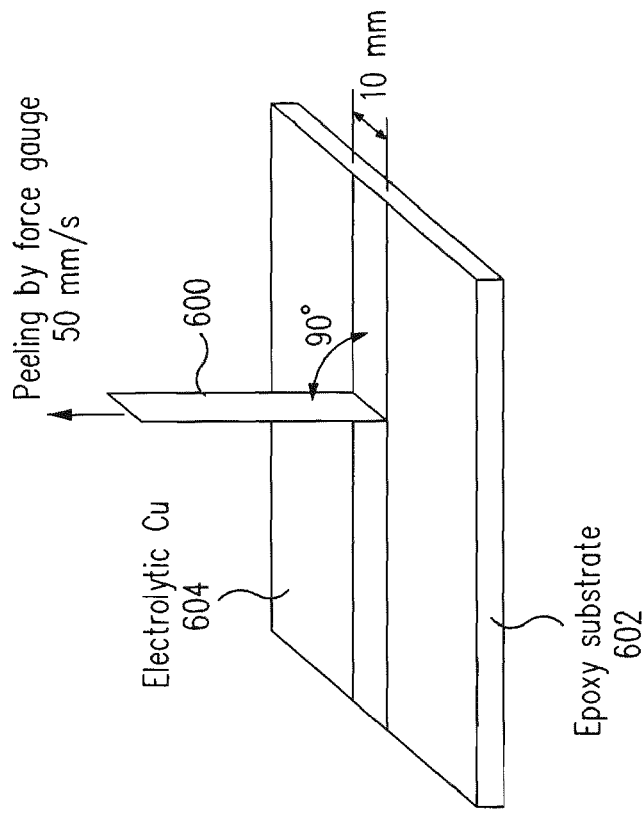
FIGS. 16A and 16B schematically illustrates quantitative characterization of peel strength of electrolytic copper deposited on epoxy substrate according to methods of the present invention.
Figure 16A:
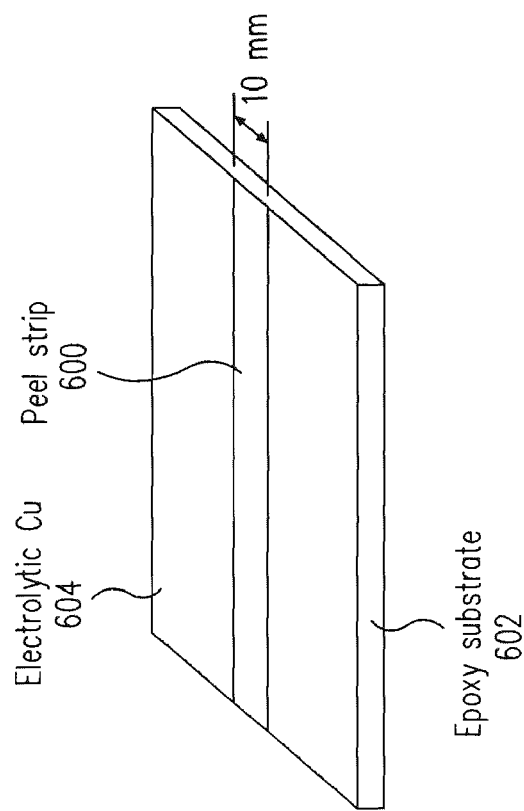

Electrodeposition was applied to the electroless Cu covered substrate to increase the thickness of copper up to 25~50 μm for peel strength evaluation. The substrate was first cleaned in 1 M sulfuric acid, then electroplated in Shipley/Copper Gleam ST-901 Acid Copper at 1 A/dm$^2$, 23° C. for 120 min, followed by DI water rinse at 23° C. for 1 min and blown dry with air at 23° C. for 1 min. The sample was then annealed in air at 150° C. for 60 min. Next, peel strength is tested on the electrolytic copper layer. FIGS. 16A and 16B schematically illustrates the peel strength test technique. First, a peel strip 600 of 10 mm width is prepared by making cuts on the two sides of a test coupon, in this instance epoxy substrate 602 having electroless and electrolytic copper 604, formed thereon by methods of the present invention. Second, the peel strip 600 is clamped to the force gauge of a peel tester. Peel strength is then measured at a 90 degree peel angle and peel speed of 50 mm/min. FIG. 17 illustrates that the peel strength of the electrolytic copper on porphyrin attached surface is increased by a factor of 10 compared to the control without molecule attachment.

The foregoing methods and description are intended to be illustrative. In view of the teachings provided herein, other approaches will be evident to those of skill in the relevant arts, and such approaches are intended to fall within the scope of the present invention.

We claim:

1. A printed circuit board, comprising:
   at least one substrate;
   a layer of organic molecules attached to the at least one substrate wherein the layer of organic molecules is comprised of: a metal-binding molecule selected from the group of a porphyrin, a porphyrinic macrocycle, an expanded porphyrin, a contracted porphyrin, a linear porphyrin polymer, a porphyrinic sandwich coordination complex, or a porphyrin array, and said organic molecules further bearing one or more binding groups configured to bind metals and one or more attachment groups configured to attach to the organic molecule to the substrate; and
   a metal layer atop said layer of organic molecules.

2. The printed circuit board of claim 1 wherein the at least one substrate is comprised of any one of more of: polymer, ceramic, carbon, epoxy, glass reinforced epoxy, phenol, polyimide resines, glass reinforced polyimide, cyanate; esters, polytetrafluoroethylene, Group III-IV elements, or mixtures thereof.

3. The printed circuit board of claim 1 further comprising at least two substrates forming a multi-layer printed circuit board.

4. The printed circuit board of claim 1 wherein said substrate comprises one or more vias formed therethrough, said vias having a layer of organic molecules formed thereon and a metal layer atop said layer of organic molecules.

5. The printed circuit board of claim 1 wherein said layer of organic molecules forms a sublayer which is functionalized with one or more elements.

6. The printed circuit board of claim 5 wherein the sublayer is functionalized by electro-deposition or electro-attaching of any one or more of: vinyl monomers, strained rings, diazonium salts, alkynes, Grignard derivatives, and combinations thereof.

\* \* \* \* \*